United States Patent
Thompson et al.

(10) Patent No.: US 6,900,132 B2
(45) Date of Patent: May 31, 2005

(54) SINGLE WORKPIECE PROCESSING SYSTEM

(75) Inventors: Raymon F. Thompson, Kalispell, MT (US); Jeffry A. Davis, Kalispell, MT (US); Randy Harris, Kalispell, MT (US); Dana R. Scranton, Kalispell, MT (US); Ryan Pfeifle, Kalispell, MT (US); Steven A. Peace, Whitefish, MT (US); Brian Aegerter, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/691,688

(22) Filed: Oct. 22, 2003

(65) Prior Publication Data

US 2004/0112738 A1 Jun. 17, 2004

Related U.S. Application Data

(63) Continuation-in-part of application No. 10/202,074, filed on Jul. 23, 2002, now Pat. No. 6,794,291, which is a continuation of application No. 09/437,711, filed on Nov. 10, 1999, now Pat. No. 6,423,642, which is a continuation-in-part of application No. PCT/US99/05676, filed on Mar. 15, 1999, which is a continuation-in-part of application No. 09/113,435, filed on Jul. 10, 1998, now Pat. No. 6,264,752, which is a continuation-in-part of application No. 09/041,901, filed on Mar. 13, 1998, now Pat. No. 6,350,319.

(60) Provisional application No. 60/116,750, filed on Jan. 23, 1999, provisional application No. 60/117,474, filed on Jan. 27, 1999, and provisional application No. 60/476,786, filed on Jun. 6, 2003.

(51) Int. Cl.[7] .................................. H01L 21/311

(52) U.S. Cl. ................ 438/694; 438/758; 438/780; 438/782; 438/913; 134/153; 134/157; 118/723

(58) Field of Search ............... 438/694, 780–782, 438/758, 905–909, 913; 134/153–157, 199, 902; 118/723; 156/345

(56) References Cited

U.S. PATENT DOCUMENTS

| | | | | |
|---|---|---|---|---|
| 4,998,050 A | * | 3/1991 | Nishiyama et al. | 700/248 |
| 5,353,490 A | * | 10/1994 | Kukuljan | 29/564 |
| 5,479,252 A | * | 12/1995 | Worster et al. | 356/237.5 |
| 5,544,421 A | * | 8/1996 | Thompson et al. | 34/58 |
| 5,733,024 A | | 3/1998 | Slocum et al. | |
| 6,267,853 B1 | * | 7/2001 | Dordi et al. | 204/232 |
| 6,309,520 B1 | | 10/2001 | Woodruff et al. | |
| 6,312,525 B1 | * | 11/2001 | Bright et al. | 118/719 |
| 6,334,937 B1 | | 1/2002 | Batz, Jr. et al. | |
| 6,423,642 B1 | | 7/2002 | Peace et al. | |
| 6,548,411 B2 | * | 4/2003 | Wirth et al. | 438/694 |
| 6,660,098 B2 | * | 12/2003 | Curtis et al. | 118/730 |
| 6,695,914 B2 | * | 2/2004 | Curtis et al. | 118/50 |
| 2001/0050060 A1 | * | 12/2001 | Curtis et al. | 118/729 |
| 2002/0017237 A1 | * | 2/2002 | Wirth et al. | 118/500 |
| 2002/0112738 A1 | * | 8/2002 | Parker et al. | 132/333 |
| 2003/0176067 A1 | * | 9/2003 | Wirth et al. | 438/689 |
| 2004/0129302 A1 | * | 7/2004 | Hanson et al. | 134/137 |

FOREIGN PATENT DOCUMENTS

WO    WO 99/46065    9/1999

* cited by examiner

*Primary Examiner*—Matthew Smith
*Assistant Examiner*—Granville D. Lee, Jr.
(74) *Attorney, Agent, or Firm*—Perkins Coie LLP

(57) ABSTRACT

A system for processing semiconductor wafers has process units on a deck of a frame. The process units and the deck have precision locating features, such as tapered pins, for precisely positioning the process units on the deck. Process units can be removed and replacement process units installed on the deck, without the need for recalibrating the load/unload robot. This reduces the time needed to replace process units and restart processing operations. Liquid chemical consumption during processing is reduced by drawing unused liquid out of supply lines and pumping it back to storage.

26 Claims, 24 Drawing Sheets

SINGLE WORKPIECE PROCESSING SYSTEM

This Application is a Continuation-In-Part of U.S. patent application Ser. No. 10/202,074, filed Jul. 23, 2002 and now U.S. Pat No. 6,794,291, which is a Continuation of U.S. patent application Ser. No. 09/437,711, filed Nov. 10, 1999, now U.S. Pat. No. 6,423,642, which is a Continuation-In-Part and U.S. National Phase of International Patent Application No. PCT/US99/05676, filed Mar. 15, 1999, published in English and designating the United States, and claiming priority to U.S. Patent Application Ser. Nos. 60/116,750, filed Jan. 23, 1999 and 60/117,474, filed Jan. 27, 1999. PCT/US99/05676 is a Continuation-in-Part of U.S. patent application Ser. No. 09/113,435, filed Jul. 10, 1998, now U.S. Pat. No. 6,264,752, which is a Continuation-in-Part of U.S. patent application Ser. No. 09/041,901, filed Mar. 13, 1998, now U.S. Pat. No. 6,350,319. This Application also claims priority to U.S. patent application Ser. No. 60/476,786, filed Jun. 6, 2003 and now abandoned. These Applications are incorporated herein by reference.

BACKGROUND OF THE INVENTION

Microelectronic devices are used in a wide array of products. These devices, such as memory and microprocessor chips and similar devices have traditionally been used in, for example, computers, telephones, sound equipment and other electronic products. Over the last several years, microelectronic devices have become faster, better, and less expensive. Microelectronic devices are accordingly now also used in traditionally non-electronic products, such as appliances, vehicles, toys and games, medical devices, novelty items, etc. The remarkable progress made in the microelectronic device industry has led to improved yet less expensive products of all types. It has also led to entirely new types of products.

A major factor in the development of microelectronic devices has been the machines and methods used to manufacture them. Manufacturing of microelectronic devices requires extreme precision, extremely pure materials, and an extremely clean manufacturing environment. Even tiny particles of dust, dirt, metals, or manufacturing chemicals, at almost any stage of the manufacturing process, can cause defects and failures in devices. These factors had led to the development of specialized machines, manufacturing facilities (or fabs) and manufacturing methods. Due to the costs required to design, build, equip and maintain these types of machines, minimizing out-of-service or downtime (i.e., when a machine is being repaired, serviced, or replaced) is essential.

Modern wafer processing machines typically have multiple processing units or chambers. A significant disadvantage with repairing or maintaining existing wafer processing machines is that the entire machine must often be taken offline for an extended period of time to remove and replace even a single processing chamber. When a processing chamber is removed from the machine for repair, maintenance or service, another replacement processing chamber can be mounted in the machine relatively quickly. However, the robot(s) which precisely move wafers into and out of the processing chambers must be recalibrated to operate with the new processing chamber. Recalibration is necessary to insure that the robot moves to appropriate precise locations, to place or remove wafers. Recalibration is a time-consuming process that increases the downtime for repairing or maintaining processing machines or systems. As a result, when only one processing chamber requires service or does not meet specifications, it is often more efficient to simply continue operating the machine, without using the one out-of-specification processing chamber, until additional chambers also need service, or some other event in the fab provides an opportunity to service the machine without interrupting production. The loss of throughput of a single processing chamber, therefore, is not as severe as the loss of throughput caused by taking the machine offline to repair or maintain a single processing chamber.

However, using the machine with less than all of the processing chambers in operation effectively increases the operating costs of the machine and slows down production of wafers.

Manufacturing of microelectronic devices involves using various chemicals. These chemicals are typically in liquid form, although gases and vapors are also often used. These chemicals must be highly pure and are therefore expensive. Chemicals used in some processes, such as strong acids or oxidizers, are also toxic. Use of these chemicals, and disposal of the chemicals after they are used, can be time consuming and expensive. Consequently, reducing the amount of chemicals used is highly advantageous.

Various techniques have been used to reduce downtime of machines and systems in wafer manufacturing, and to reduce consumption of chemicals. While these techniques have met with varying degrees of success, engineering challenges remain in trying to make further improvements. Accordingly, it is an object of the invention to provide better systems and methods for processing workpieces or wafers.

SUMMARY OF THE INVENTION

The inventors have created a new processing system which provides dramatic improvements in manufacturing microelectronic and similar devices. This new system allows process chambers to be replaced, without the need to recalibrate the process robots, which load and unload wafers into and out of the process chambers. Since recalibration is no longer needed, downtime for serving or maintaining manufacturing machines is greatly reduced. As a result, the machines and the entire fab facility can be more productive and efficient, and operate more consistently and smoothly. This ultimately allows for manufacture of micro-electronic devices at lower costs.

The inventors have also developed a simple, yet remarkably effective way to reduce chemical consumption, without affecting any characteristics of the manufacturing process. Chemical liquids are pumped out of supply lines, and back into storage supply tanks or containers. Consequently, the volume of liquid in the supply lines is available for use in a subsequent manufacturing operation. Loss of the chemical liquid by purging the supply lines to a waste drain is avoided. Hence, consumption of chemicals is reduced. In addition, less liquid waste is generated.

In a first aspect providing extraordinary advantages, a system or machine for processing wafers is designed to allow processing chambers to be quickly interchanged, without having to recalibrate the robot, transport system or other components of the system. As a result, down time associated with repairing or maintaining processing chambers is dramatically reduced. Since much less time is needed to replace a processing chamber, each chamber can be replaced virtually immediately, as needed. The requirement or practice of waiting until e.g., two or more chambers need replacement, and the associated loss of efficiency, are avoided.

In a second aspect, breaking sharply from conventional design principles, virtually all position adjustment features used to adjust relative positions of the robot(s), the deck, chassis or frame, and the processors (of any type), are eliminated. Rather, fixed non-adjustable positioning elements accurately locate each of these subsystems. The robot or processor is simply placed on or relative to the deck. The positioning elements automatically correctly locate them (in three dimensions). Fasteners, such as bolts are used only to hold the subsystems in place, but not for positioning or locating. Adjustment features, such as jacking screws, shims, etc., used in the past to position or align the subsystems, after they are installed, are avoided. Consequently, initial set up and calibration of the system is much simpler and faster.

In a third and separate aspect, chemical liquid in a supply line is returned to a source, tank or container, rather than being purged to a waste drain. Consumption of chemicals and generation of waste, are reduced. The invention resides as well in the subsystems described.

BRIEF DESCRIPTION OF THE DRAWINGS

In the drawings, wherein the same reference number denotes the same element, throughout the several views.

DETAILED OF DESCRIPTION OF THE DRAWINGS

The invention is directed to apparatus and methods for processing a workpiece, such as a semiconductor wafer. The term workpiece, wafer, or semiconductor wafer means any flat media or article, including semiconductor wafers and other substrates or wafers, glass, mask, and optical or memory media, MEMS substrates, or any other workpiece having micro-electronic, micro-mechanical, micro-fluidic or microelectro-mechanical devices.

Figure 1:
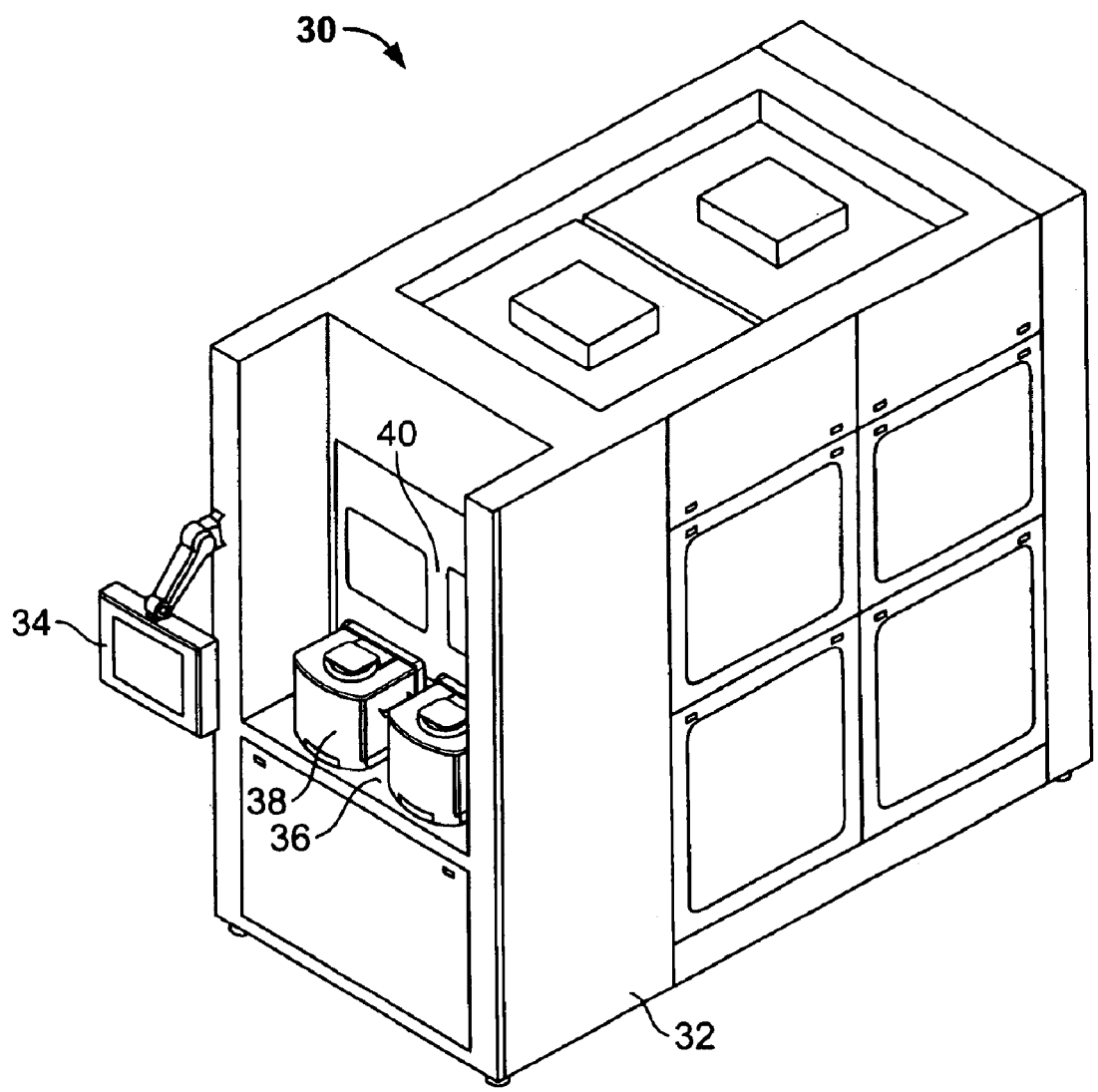
FIG. 1 is a perspective view of a workpiece processing system.

As shown in FIG. 1, a processing system 30 has an enclosure 32, a control/display 34, and an input/output station 36. Wafers or workpieces within pods or boxes 38 (e.g., FOUPs) are removed from the boxes 38 at the input/output station 36 and processed within the system 30.

Figure 2:
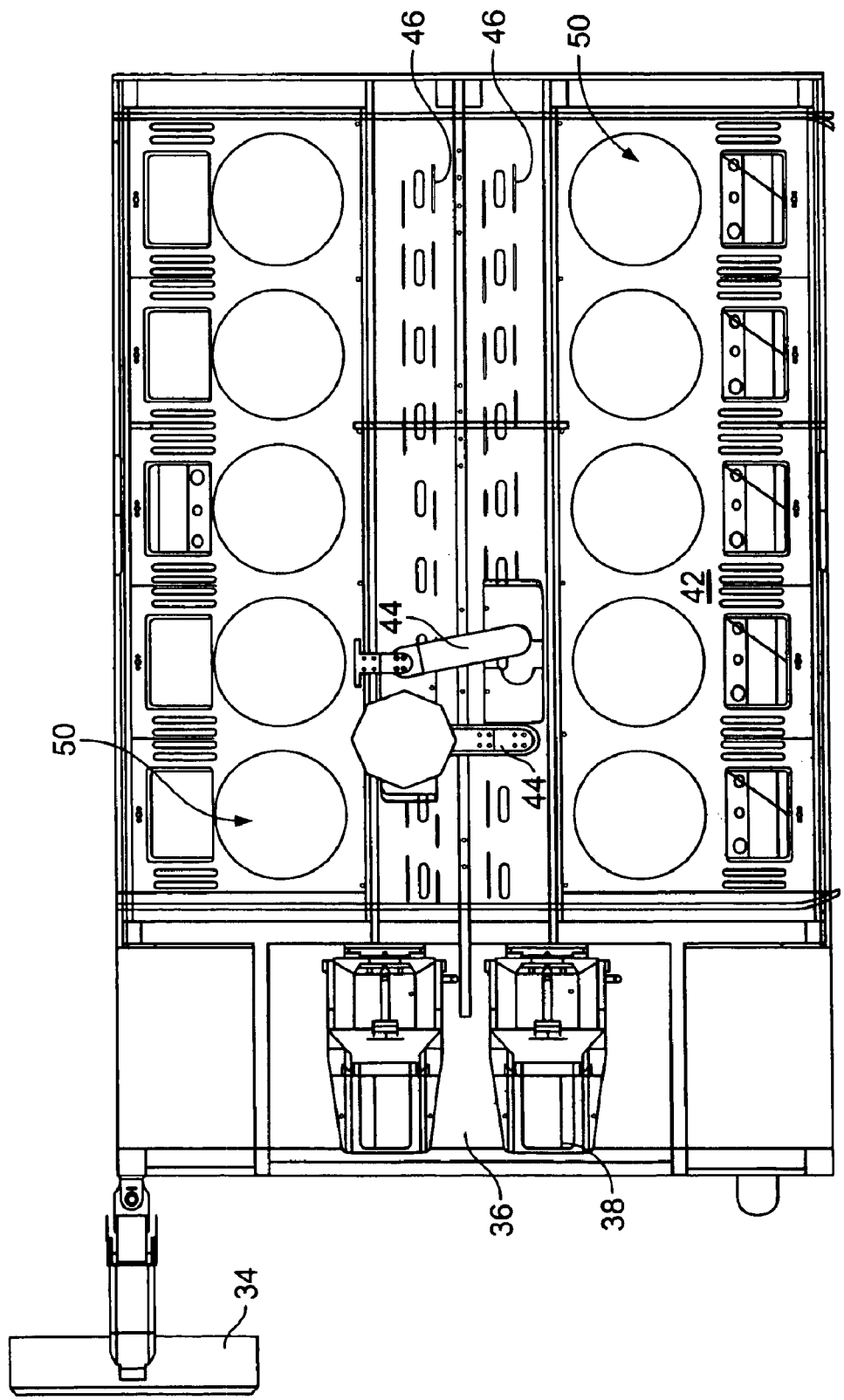
FIG. 2 is a plan view of the system shown in FIG. 1.

Turning to FIG. 2, the processing system 30 preferably includes a frame 42 that supports a plurality of workpiece processors 50 within the enclosure 32. Each workpiece processor 50 may be configured to process workpieces, such as 200 or 300 mm diameter semiconductor wafers provided within sealed boxes 38, open cassettes, or other carriers or containers.

The frame 42 in FIG. 2 is shown supporting ten workpiece processors 50, but any desired number of processors 50 may be included in the enclosure 32. The frame 42 preferably includes a centrally located, longitudinally oriented path 46 between the processors 50. One or more robots 44 preferably move on rails along the path 46 to load and unload workpieces into and out of the processors 50.

Figure 3:
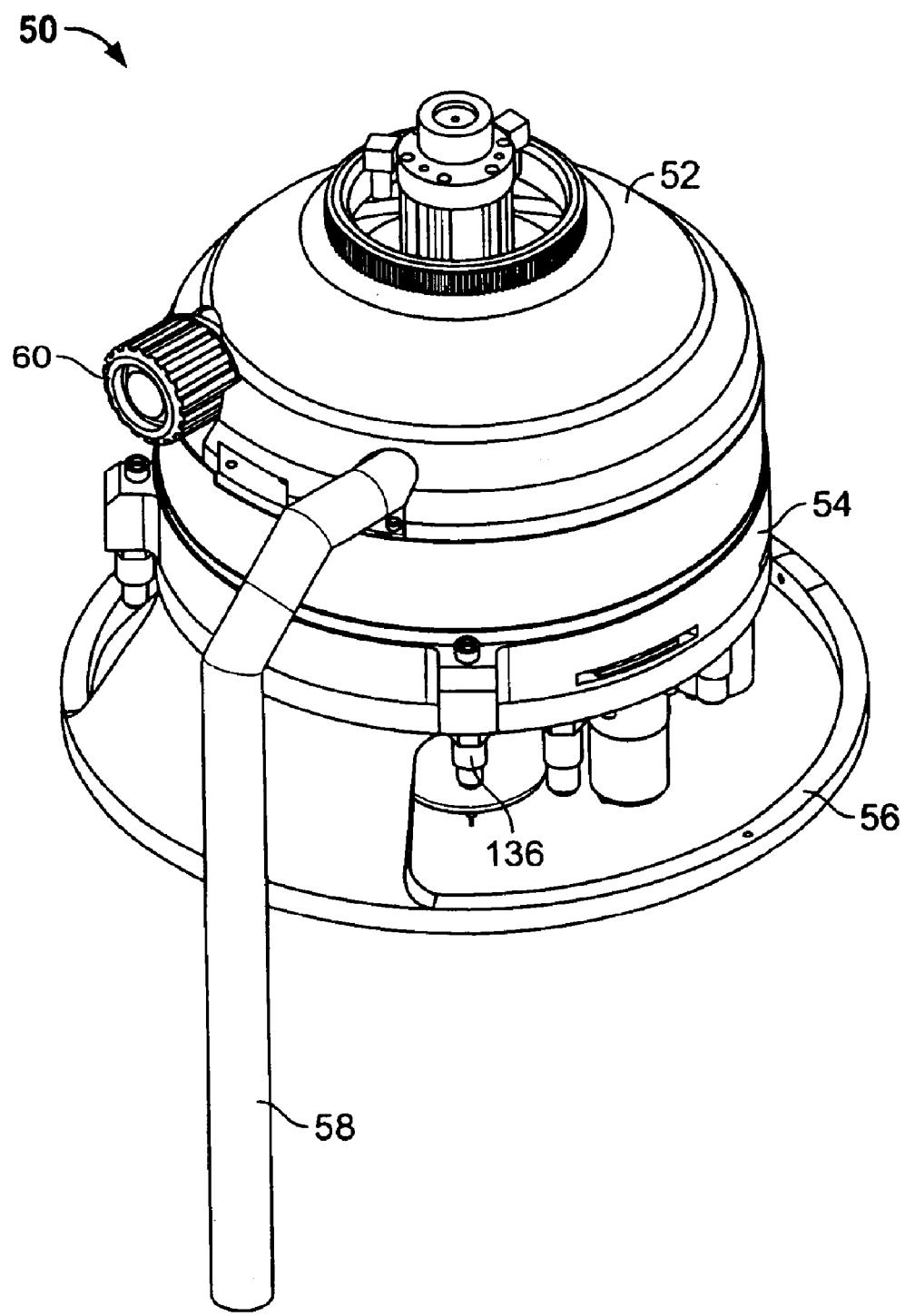
FIG. 3 is a perspective view of one of the process chambers or units shown in FIG. 2.
Figure 4:
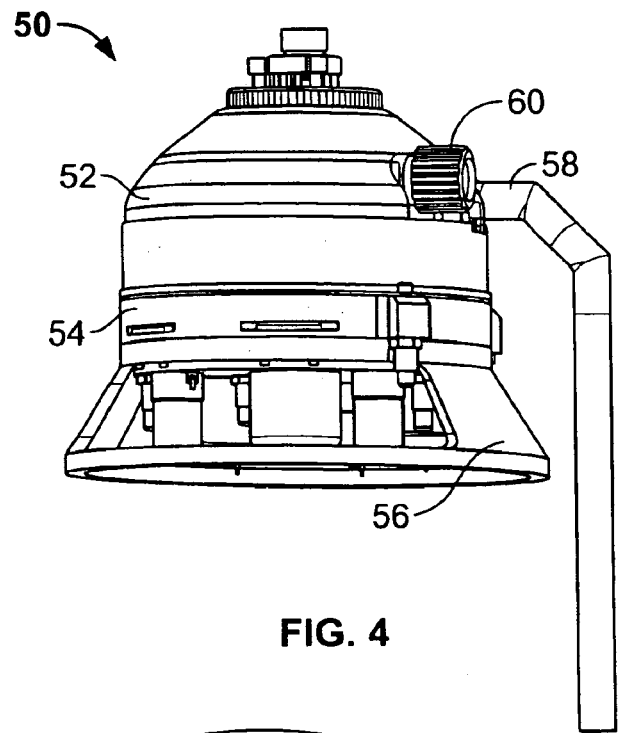
FIG. 4 is a side view of the process unit shown in FIG. 3.
Figure 5:
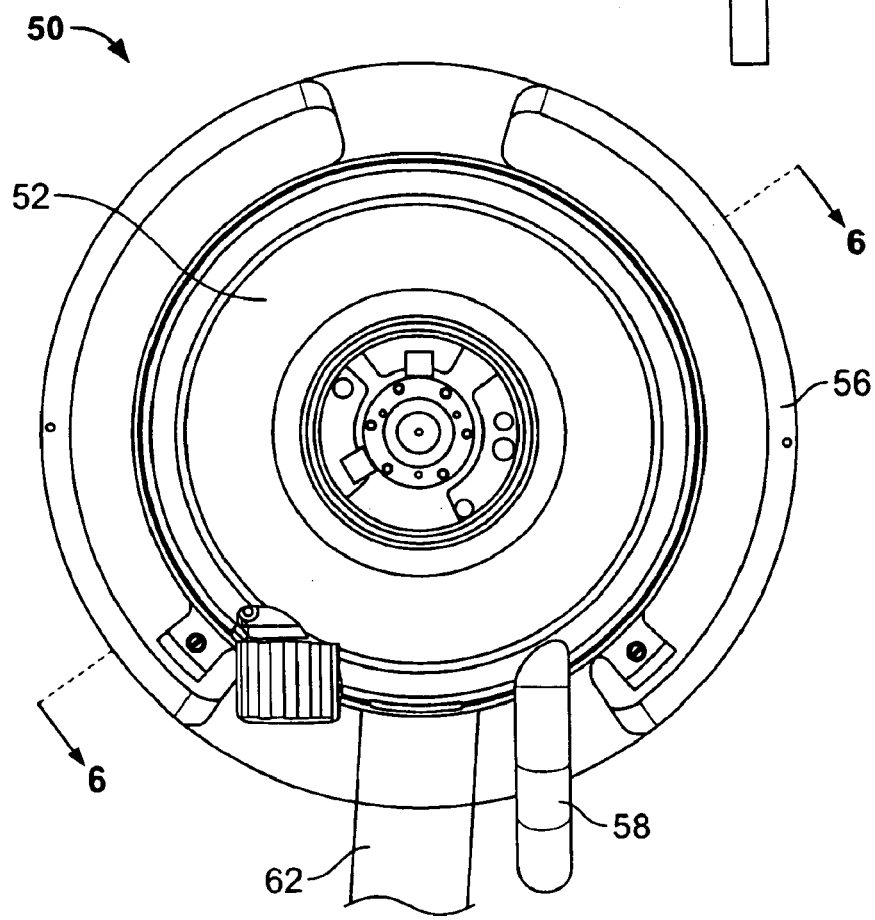
FIG. 5 is a top view thereof.

Turning to FIGS. 3, 4 and 5, a processor, or process chamber 50, for use in the system 30 shown in FIGS. 1 and 2, has a head 52 which can be moved vertically, to engage with and separate from a base or bowl 54. A base mounting ring 56 is rigidly attached to the base 54, and is used to precisely locate the processor 50 on the frame 42.

A conduit or liquid/gas supply line 58 supplies process liquids or gasses to the head 52, from sources within the processing system 30, or elsewhere in the fab or manufacturing facility. An electrical connector or fitting 60 connects with a cable (not shown) to make power/signal control, or other electrical connections to the head 50. As shown in FIG. 5, a lift arm 62 connects to the head 50, for raising and lowering the head 50 relative to the base 54, to move the head between load/unload and process positions.

Figure 6:
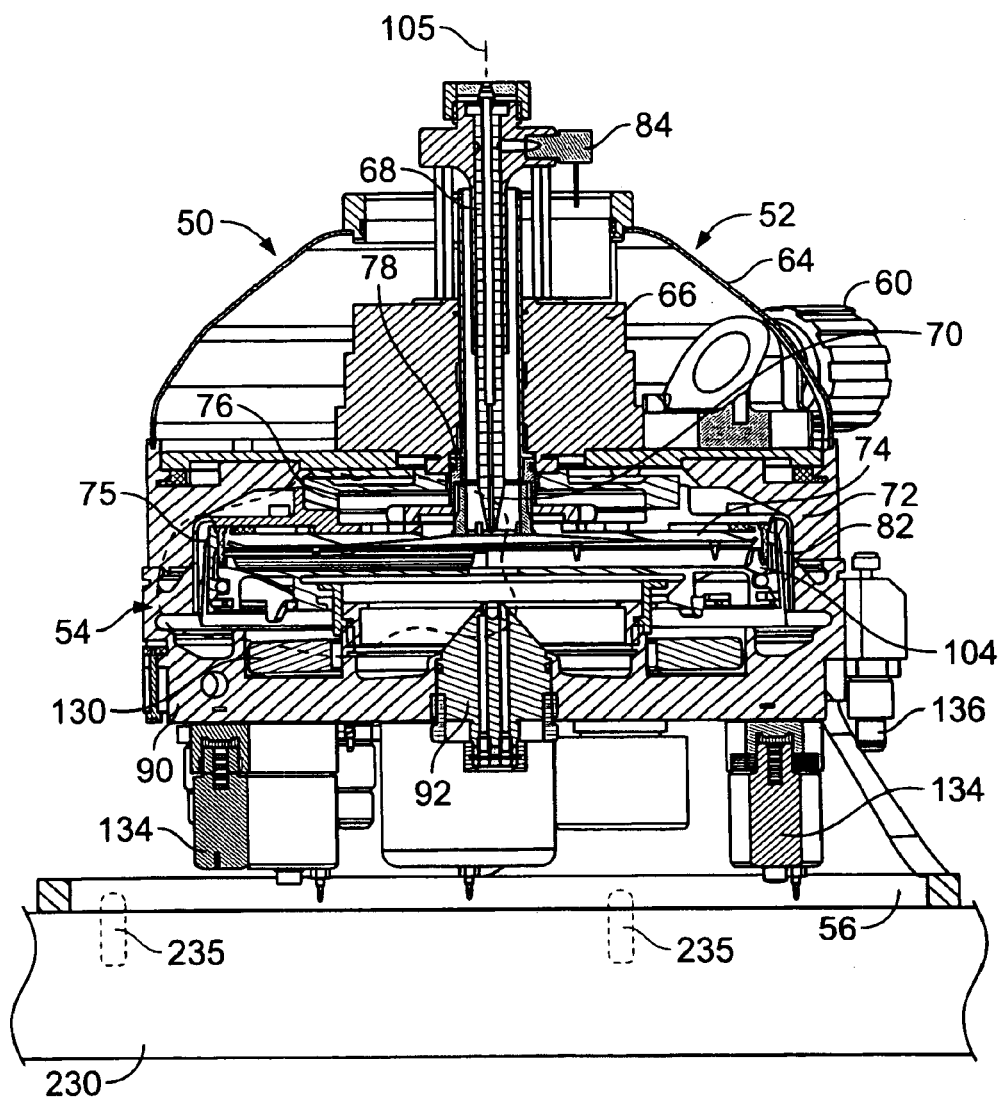
FIG. 6 is a section view taken along line 6—6 of FIG. 5.
Figure 7:
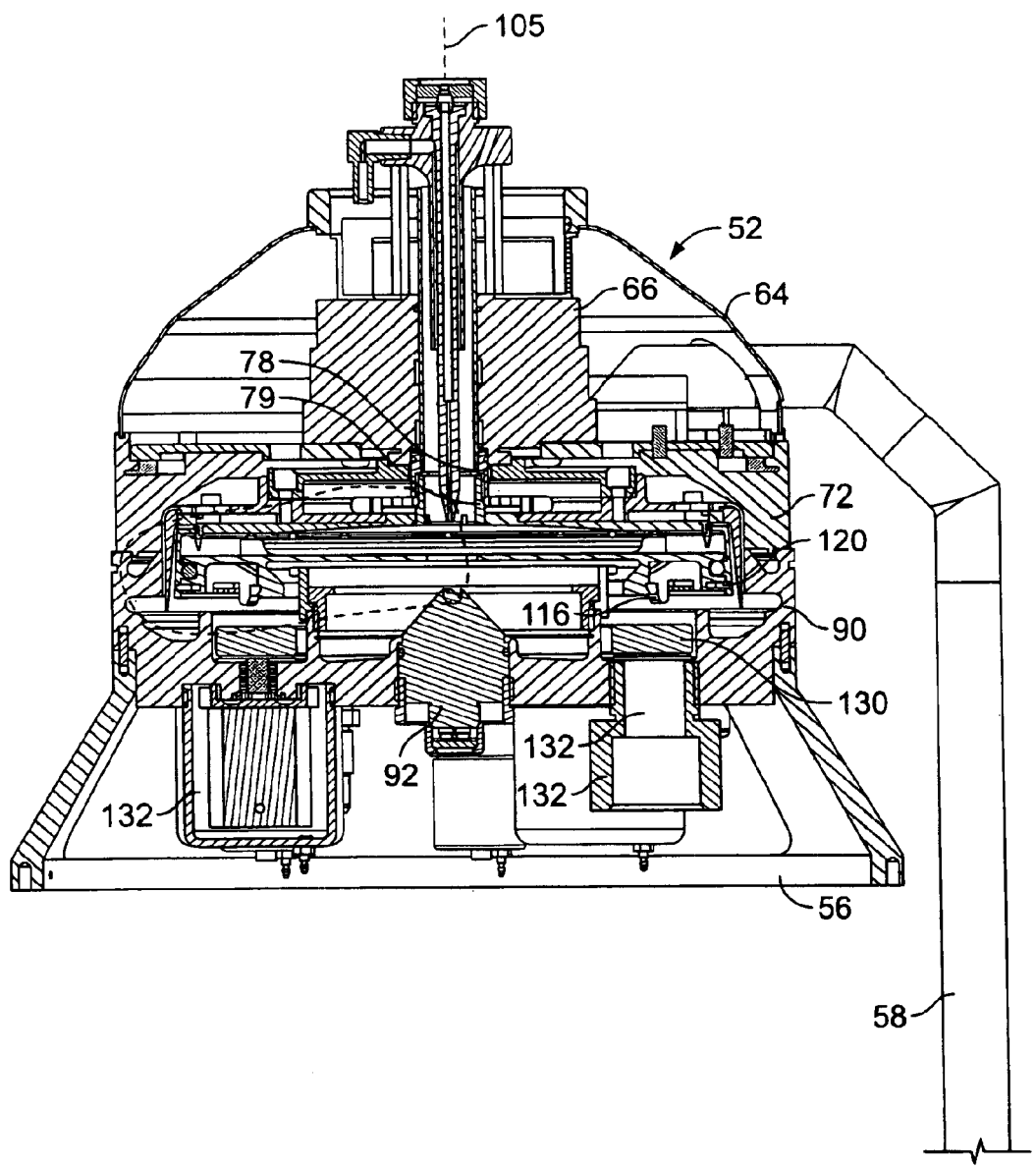
FIG. 7 is an alternate section view thereof.

Turning to FIGS. 6 and 7, on the head 52, a cover 64 is attached to a head ring 72. A spin motor 66 is attached to and spins an upper rotor 74. An upper nozzle manifold 68 extends down centrally through the head 52, to an upper nozzle 70, positioned to spray or otherwise apply a processing liquid or gas onto a wafer 80 within the processor 50.

Figure 8:
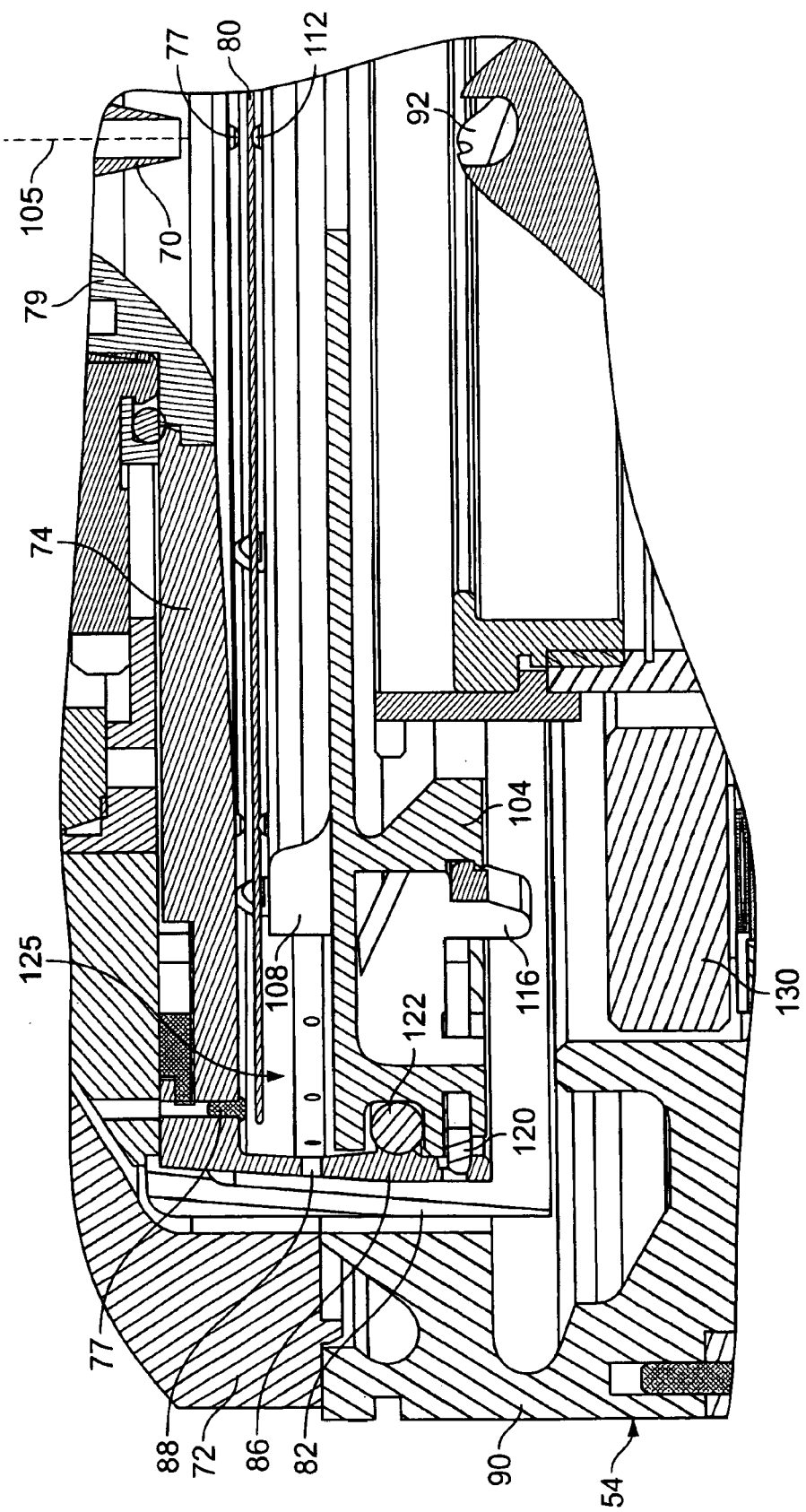
FIG. 8 is an enlarged detail of a workpiece within the process unit shown in FIGS. 3–5.
Figure 9:
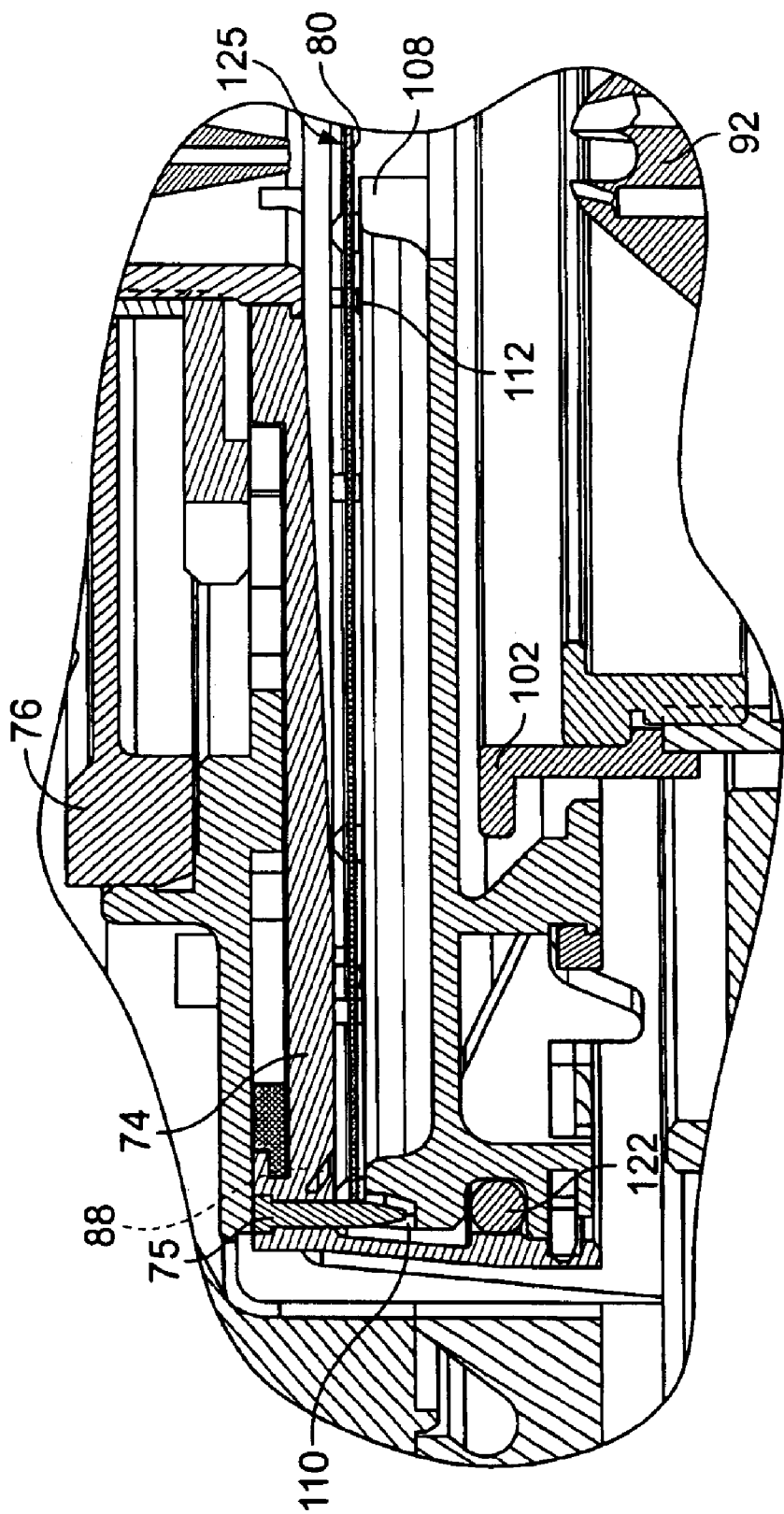
FIG. 9 is an alternative section view thereof rotated to show additional features.
Figure 10:
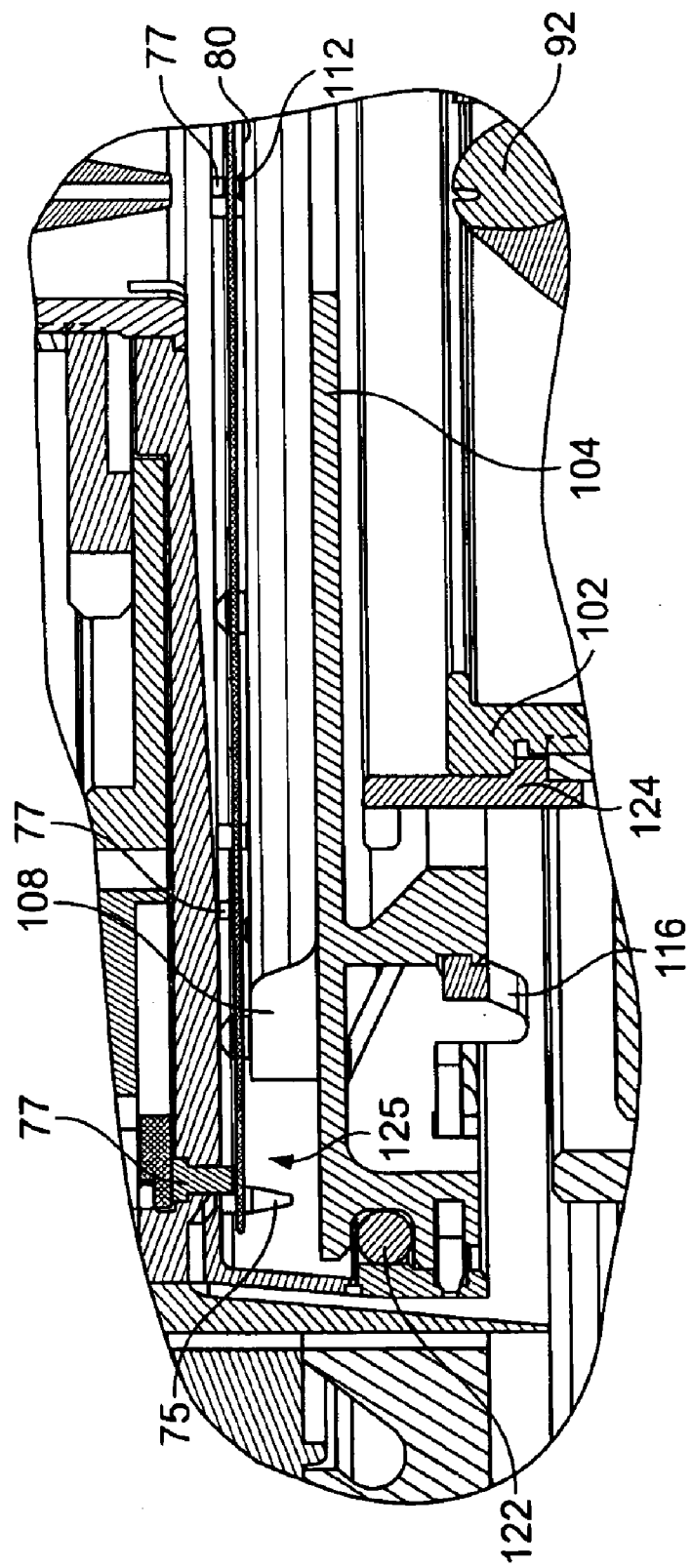
FIG. 10 is another enlarged section view detail showing a workpiece within the process unit.

Referring to FIGS. 8, 9, and 10, the upper rotor 74 is connected to a shaft 79 driven by the motor 66. As shown in FIG. 7, the shaft 79 is supported within the head 52 via bearings 78. As shown in FIG. 8, a downwardly extending flange 86 on the upper rotor 74 includes multiple spaced apart drain outlets 88. A skirt 82 surrounds the flange 86.

Figure 11:
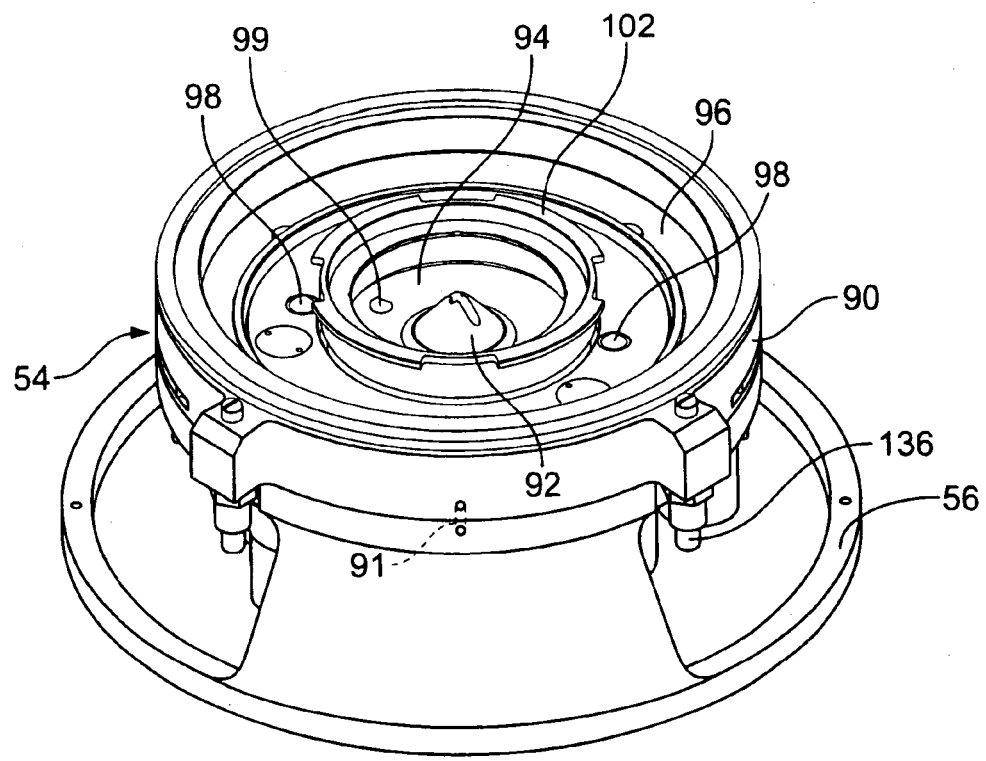
FIG. 11 is a top perspective view of the lower section, base, or bowl of the processor shown in FIGS. 3–5.
Figure 12:
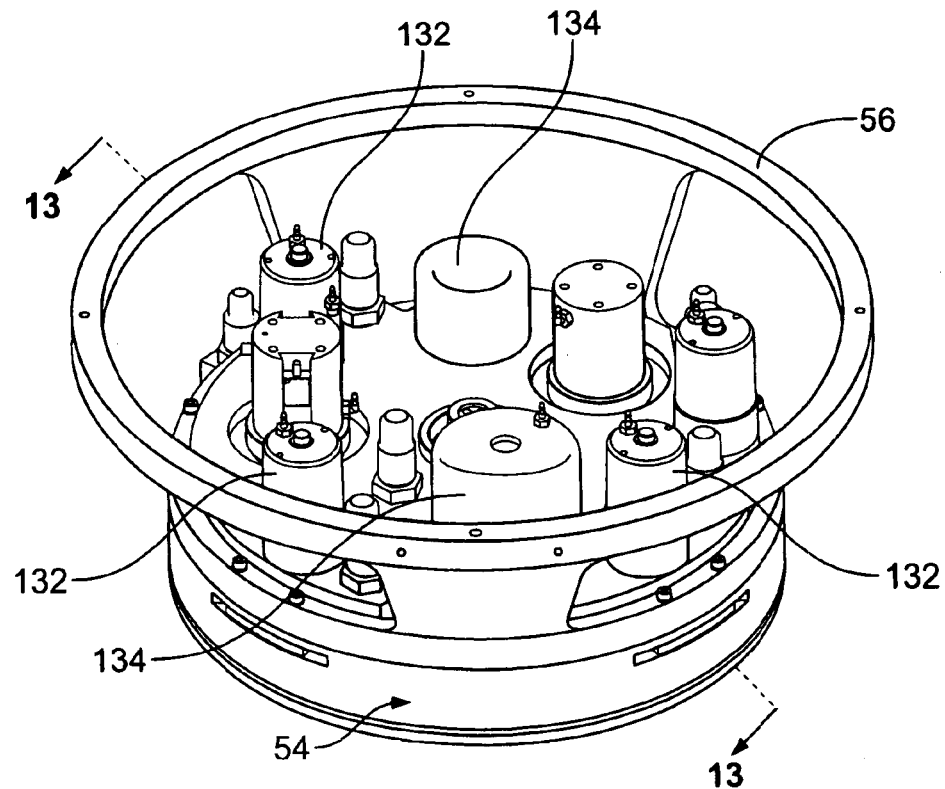
FIG. 12 is a bottom perspective view thereof.

Turning momentarily to FIGS. 11 and 12, a base ring 90 is precisely located on the mounting ring 56, preferably via alignment pins 91. A lower rotor pedestal 102 is centrally located within the base ring 90. An inner drain ring or space 94 is formed concentrically around a lower nozzle 92 and the pedestal 102. An outer drain ring or space 96 is formed between the pedestal 102 and the cylindrical side walls of the base ring 90. Multiple drain openings 98 and 99 are provided in the outer and inner drain rings 96 and 94, respectively. Valve actuators 134 open or close the drain valves, to allow used process liquids to drain out of the processor 50, through the drain openings 98 and 99, at appropriate times.

Figure 16:
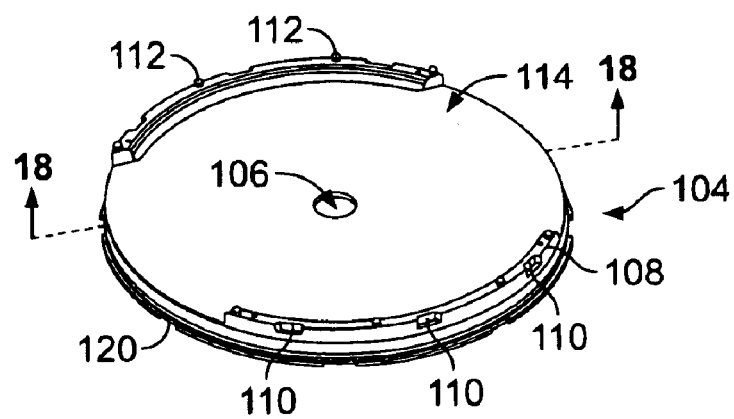
FIG. 16 is a top perspective view of a lower rotor of the processor, as shown in FIGS. 6–10.
Figure 17:
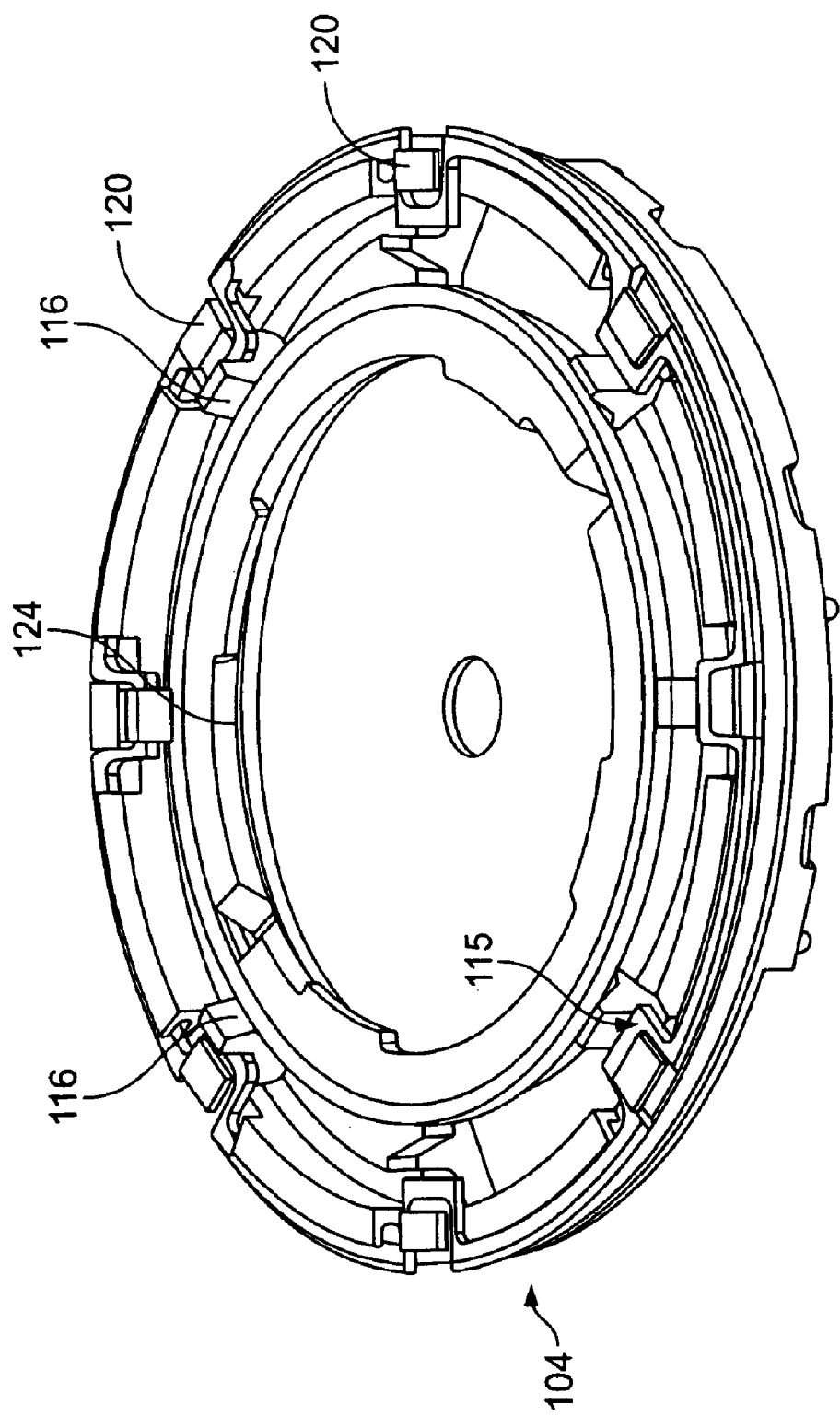
FIG. 17 is a bottom perspective view thereof.
Figure 18:
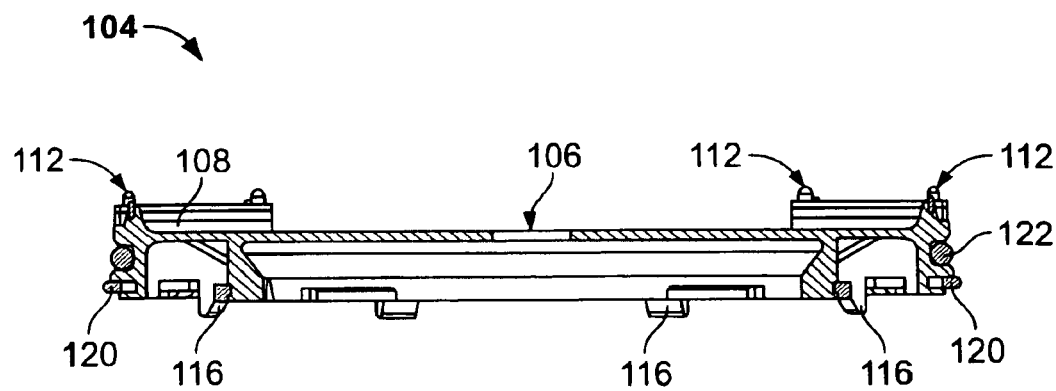
FIG. 18 is a section view taken along line 18—18 of FIG. 16.

Referring now to FIGS. 16, 17 and 18, a lower rotor 104 has a central opening 106 which aligns over the lower nozzle 92. A pair of spaced apart shoulders 108 on the top surface of the lower rotor 108 include tapered alignment slots or openings 110, as well as upwardly projecting wafer support pins 112. The shoulders 108 are spaced apart creating a robot or automation slot 114 shown in FIG. 16. This allows an end effector of a robot to move in underneath a wafer 80 supported on the support pins 112, to load and unload a wafer 80 into or out of the processor 50.

Turning to FIG. 17, a locking subsystem or assembly 115 is provided on the lower rotor 104, to lock the lower rotor 104 into engagement with the upper rotor 74, during processing. The locking subsystem 115 includes a resilient retainer ring 118 on the bottom surface of the lower rotor 104, as shown in FIG. 17. The retainer ring 118 includes spaced apart ring tabs 120. A cam 116 is associated with each ring tab 120. Referring momentarily back to FIGS. 6 and 7, an annular actuating ring 130 is positioned around the outside of the pedestal 102. Ring actuators 132 in the base 54 move the actuator ring 130 up and down. As the actuator ring 130 moves up, it pushes on the cams 116. The cams pivot or rotate, pulling the ring tabs 120 radially inwardly, to release or disengage from the upper rotor. When the cam actuators 132 move the actuator ring 130 to a lowered position, the cams 116 rotate to the position shown in FIG. 18, releasing the ring tabs 120 and allowing the ring tabs 120 to resiliently extend outwardly to engage the upper rotor. In this way, the locking system 115 locks the upper and lower rotors together, for processing, and releases them, for loading and unloading. As shown in FIGS. 8 and 18, an O-ring or seal 122 within a groove on the lower rotor 104 seals the lower rotor 104 against the flange 86 of the upper rotor 74, when the processor 50 is in the closed position. The ring actuators 132 and valve actuators 134 are preferably pneumatically operated. The upper and lower rotors are preferably Teflon (fluorine resins) to better resist corrosion by process chemicals. Other components may be stainless steel.

Referring to FIGS. 11 and 17, the bottom surface of the lower rotor 104 includes a bayonet or interrupted tab/slot fitting 124, which engages with a complimentary fitting on the pedestal 102. As shown e.g., in FIG. 10, this allows the lower rotor 104 to be securely supported on the pedestal 102 during loading and unloading, and also allows the lower rotor to spin within the base 54, when engaged with the upper rotor 74. Referring to FIGS. 9 and 10, alignment pins 75 on the upper rotor engage into pin slots 110 on the lower rotor, when the upper rotor is brought down into engagement with the lower rotor. Referring to FIGS. 8, 9, and 10, this aligns the upper and lower rotors, and also the wafer 80, about the spin axis 105 of the processor 50. The wafer 80 is aligned with the spin axis 105 via the alignment pins 75 in contact with, or closely adjacent to the edges of the wafer 80. The wafer is supported below by the support pins 112 on the shoulders 108 of the lower rotor 104. The wafer 80 is supported, positioned, or held down from above, by support pins 77 extending downwardly from the upper rotor 74. The wafer or workpiece 80 is supported or aligned axially via the alignment pins 75.

Figure 13:
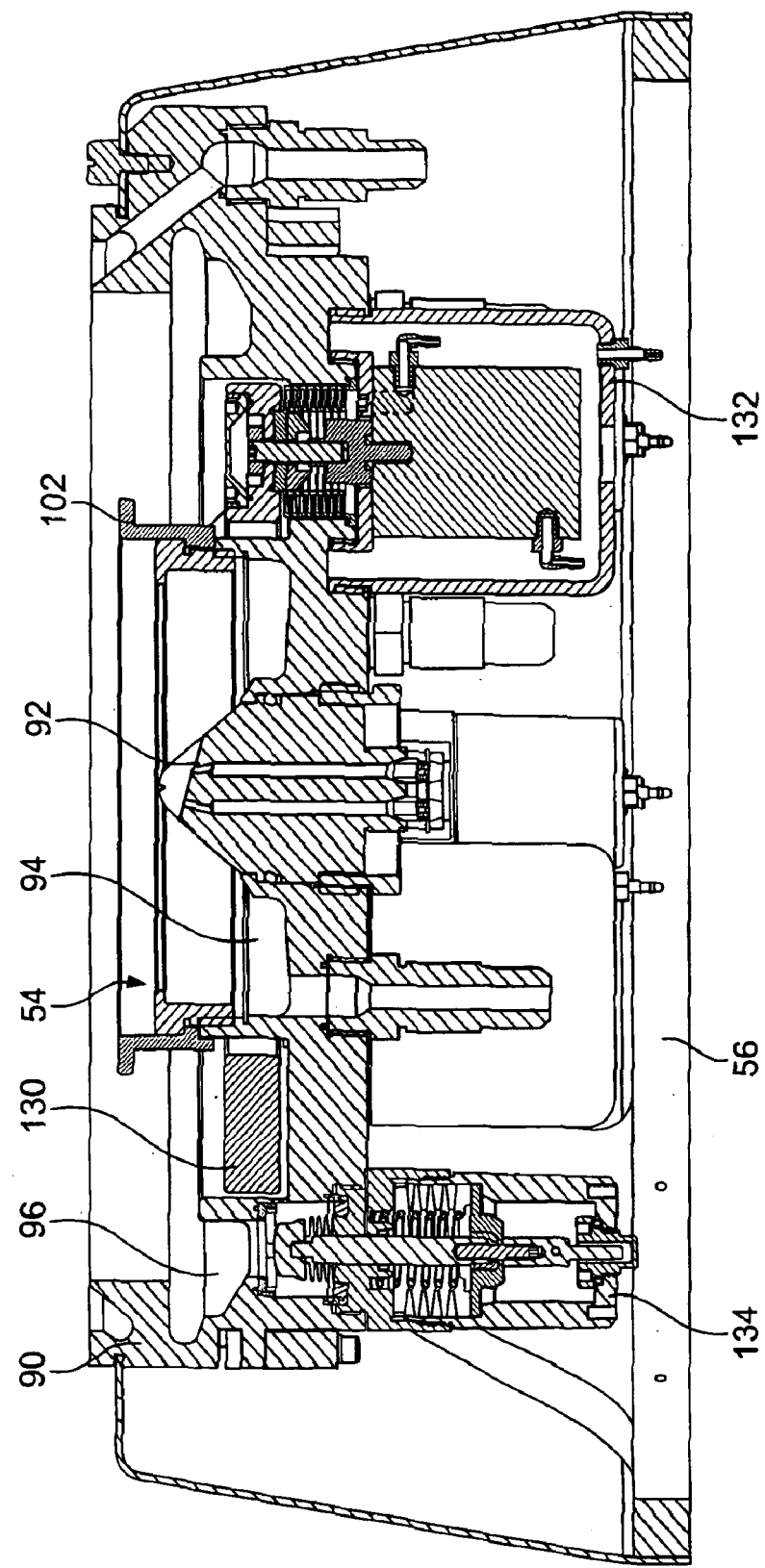
FIG. 13 is a section view taken along line 13—13 of FIG. 12.
Figure 14:
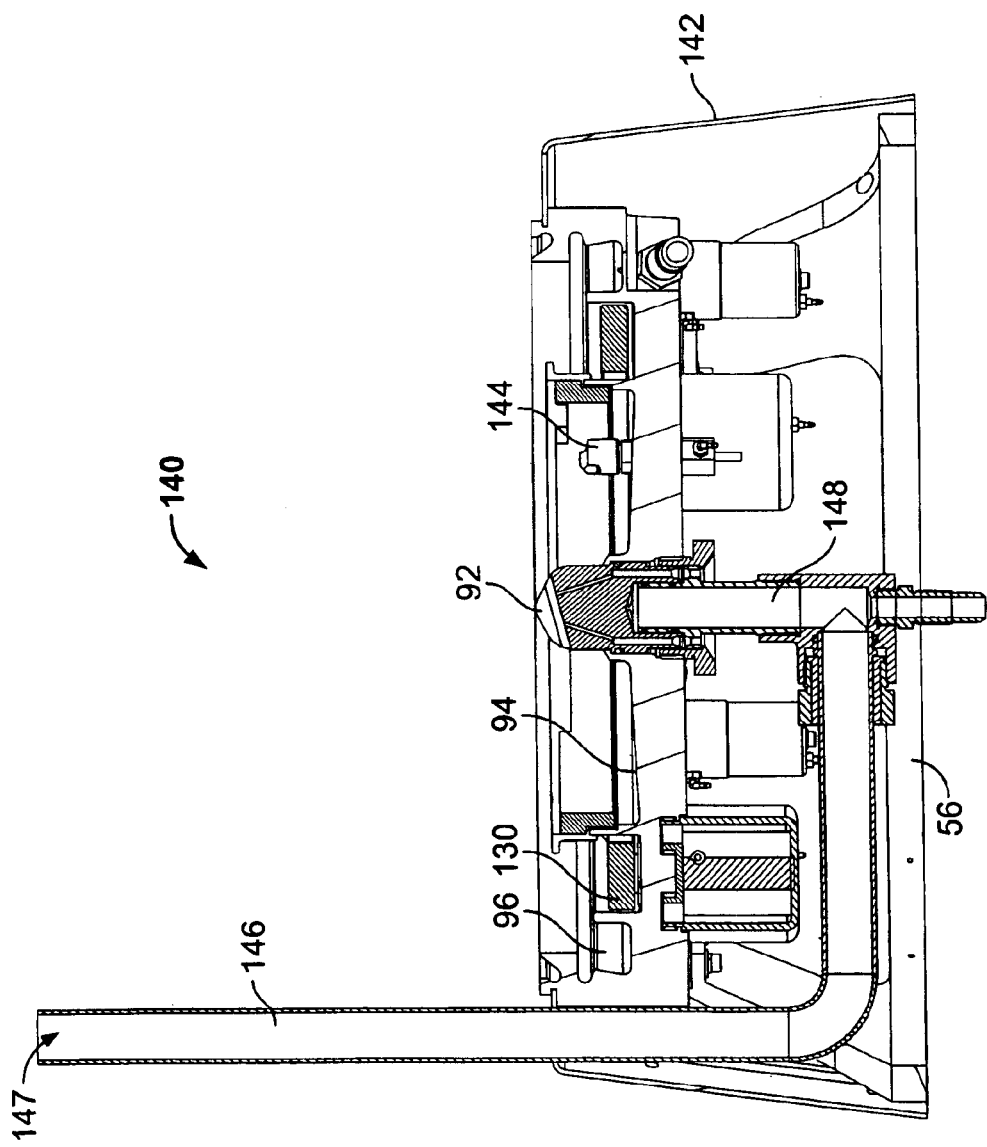
FIG. 14 is a section view of an alternative base design.

FIG. 14 shows an alternative base design 140 which is similar to the base 54 shown in FIGS. 11, 12 and 13, but further includes a supplemental air supply pipe or snorkel 146 connecting to the lower nozzle 92. As the upper and lower rotors spin within the processor 50, a low pressure zone is created adjacent to the spin axis 105. Air is drawn in through the pipe 146 to the nozzle 92, to assist during drying steps. The inlet or opening 147 of the pipe 146 is vertically above the top of the processor 50. Consequently, the potential for airborne particles entering the pipe 146 and the process chamber 125 formed between the rotors (and shown in FIGS. 8 and 10), is reduced. Referring still to FIG. 14, in the base embodiment 140 shown, a supplemental side spray nozzle 144 is also provided to spray a broader area of the bottom surface of the wafer 80.

Figure 15:
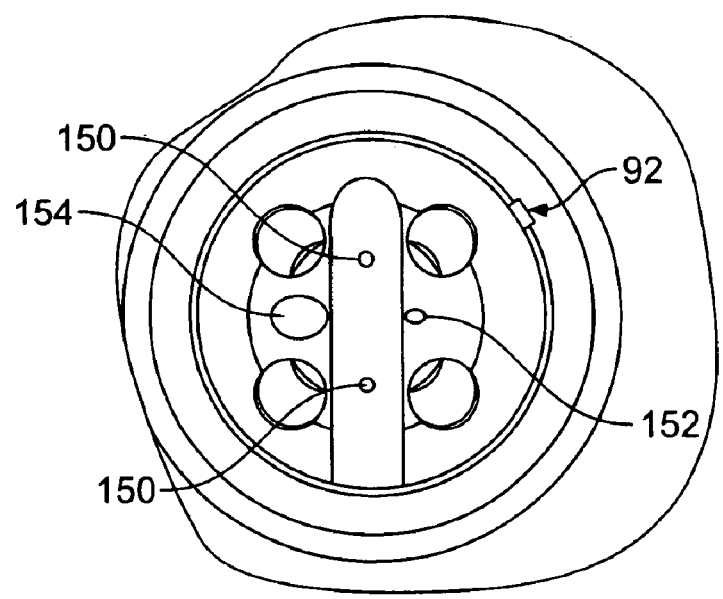
FIG. 15 is a plan view of the lower spray nozzle shown in FIGS. 11, 13 and 14.

Turning to FIG. 15, the lower nozzle 92, preferably includes first and second liquid process chemical ports or openings 150, as well as a deionized water opening 152 and a nitrogen gas outlet, opening or nozzle 154.

Figure 19:
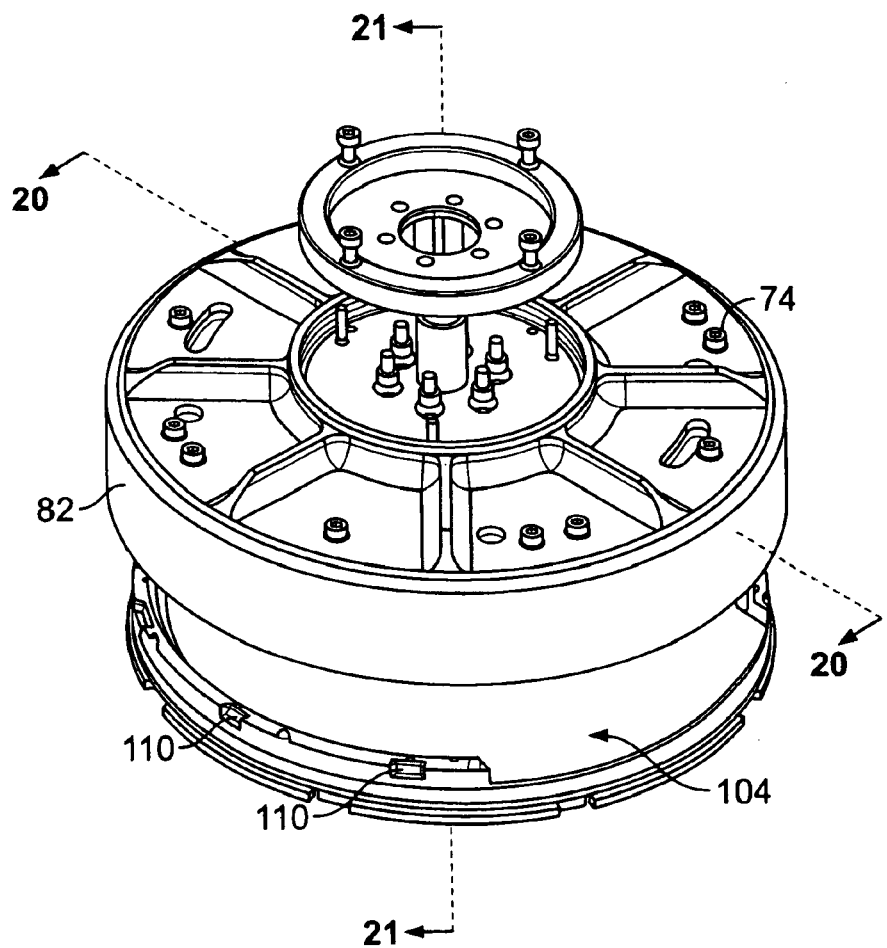
FIG. 19 is a top exploded perspective view of the upper and lower rotors shown in FIGS. 6 and 7.
Figure 20:
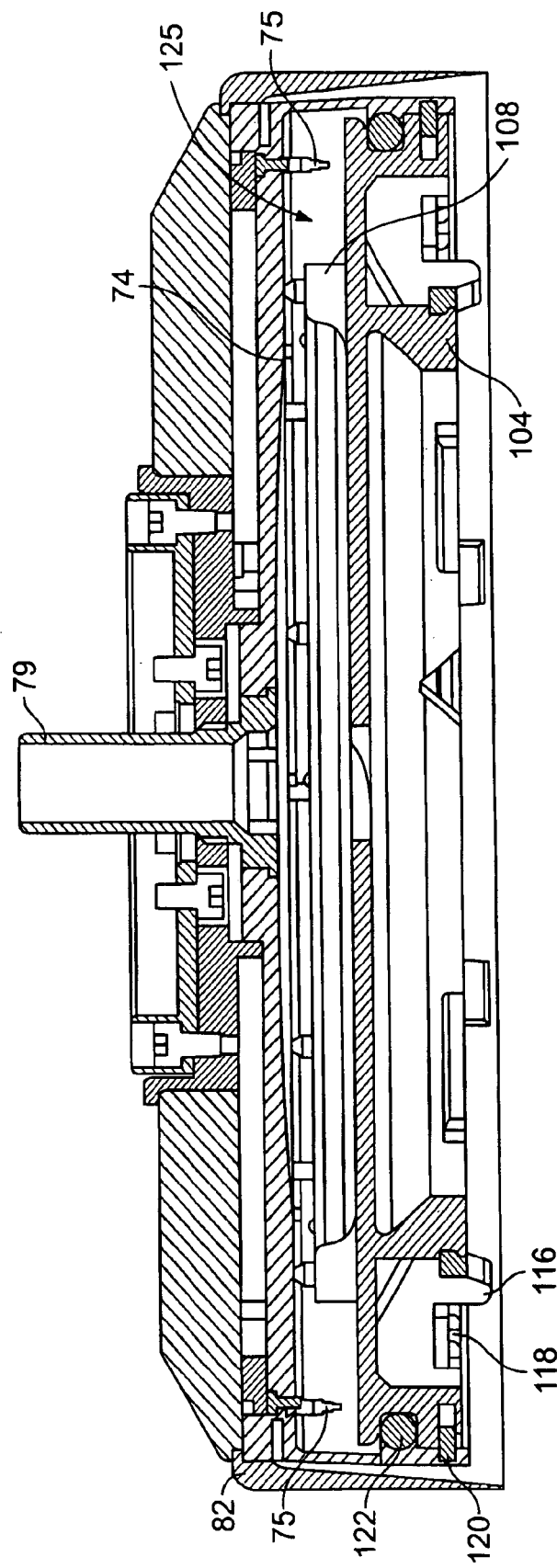
FIG. 20 is a section view taken along line 20—20 of FIG. 19.
Figure 21:
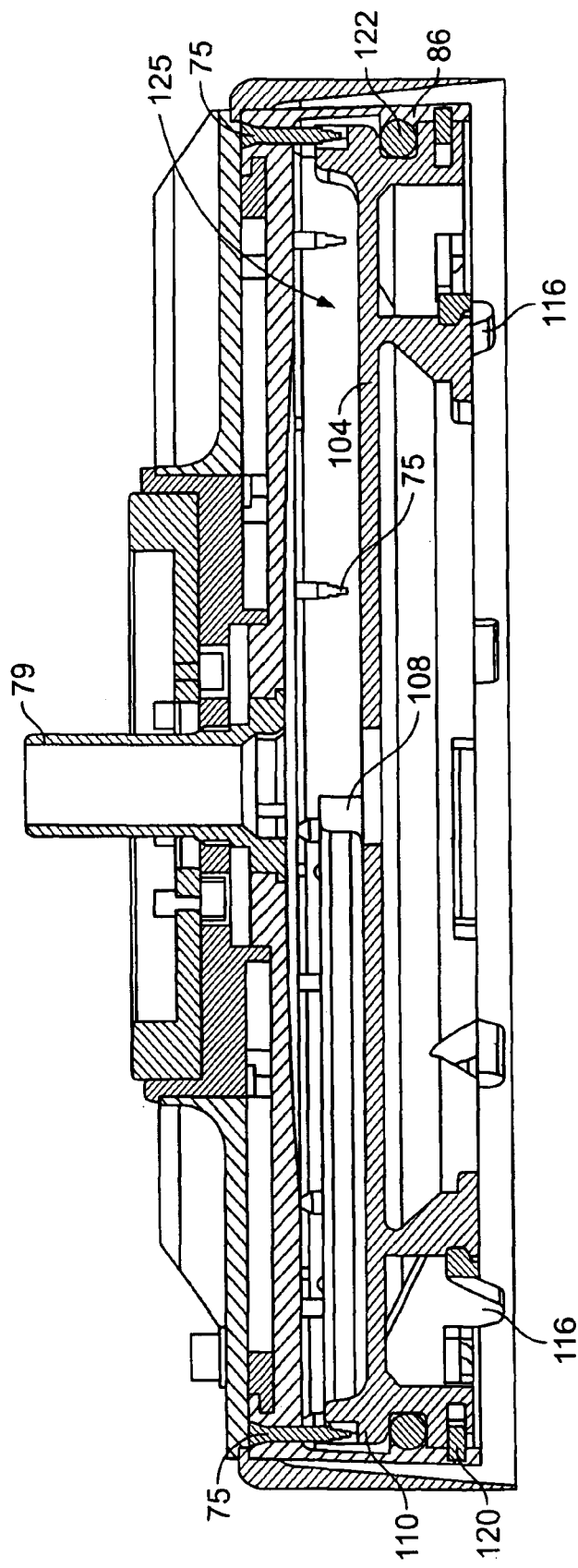
FIG. 21 is a section view taken along line 21—21 of FIG. 19.

FIGS. 19, 20 and 21 show the upper and lower rotors in isolation. The other features and components of the head 52 and the base 54 are not included in these views, only for purpose of illustration, because except for manufacture and servicing, the upper and lower rotors remain with the head and base, respectively. FIG. 19 shows the upper rotor 74 in an up or open position, for loading or unloading a wafer. The upper rotor 74 is lifted up, along with the head 52 (shown in FIGS. 3–6), when the lift arm 62 (shown in FIG. 5) lifts the head. As shown in FIG. 19, the head 52 including the upper rotor 74 is lifted sufficiently so that the skirt 82 clears or is above the robot end implement slot 114.

FIGS. 20 and 21 show the head 52 in the closed or down position, so that the upper rotor 74 is engaged with the lower rotor 104. The cam actuation ring 130 is in the released or down position, allowing the ring tabs 120 of the retainer ring 118 to extend outwardly, so that the tabs engage into grooves or slots in the flange 86 of the upper rotor 74. As a result, the upper and lower rotors are connected, causing the lower rotor and wafer to spin with the upper rotor. As shown in FIGS. 20 and 21, as the upper and lower rotors are brought together, they form a process chamber 125. Referring to FIGS. 8, 9, and 10, the wafer 80 is supported within the chamber 125 by upper and lower support pins 77 and 112. Process liquids and/or gasses are sprayed or applied onto the upper and lower surfaces of the wafer 80 via the upper nozzle 70 and lower nozzle 92, preferably while the wafer 80 is spinning along with the rotors 74 and 104. As the process fluid moves radially outwardly via centrifugal force, the flow path is controlled by location of the outlets. The seal 122 prevents fluids from moving out of the chamber 125, except through the outlets 88 shown in FIG. 9.

Figure 22:
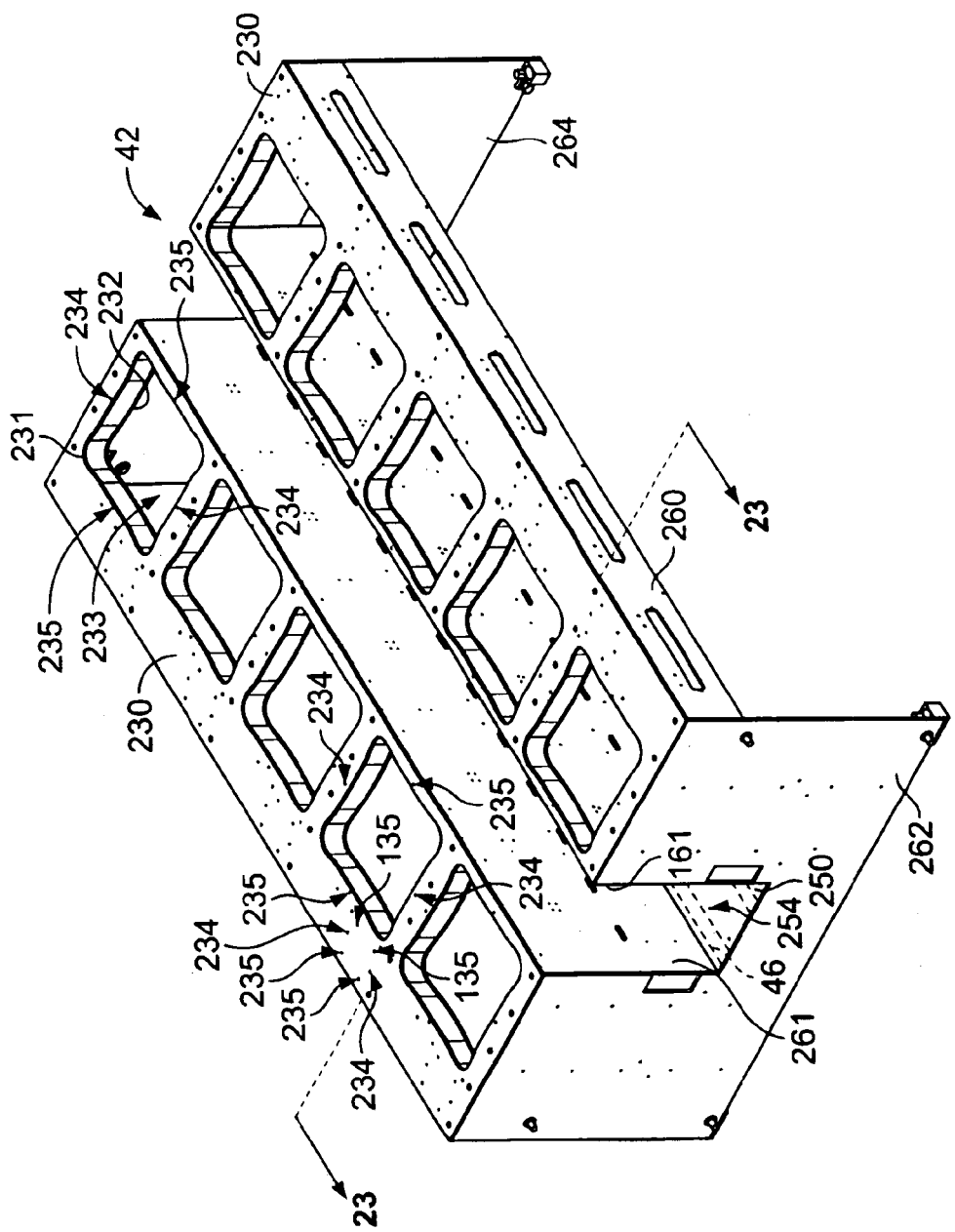
FIG. 22 is a top perspective view of a mounting module as use din the processing system shown in FIGS. 1 and 2.

FIG. 22 is a perspective view of the frame 42 shown in FIG. 2. The frame 42 may be supported on a structural member within the enclosure 32, or it may be supported directly on the floor of the manufacturing facility, or on another structure. The frame 42 is a rigid and stable structure provided to maintain relative positions between the processors 50 and the robots 44. In comparison to the enclosure, and to the deck structures used in prior known systems, the frame 42 is much more rigid, and has significantly greater structural strength. As a result, the positions of the processors 50 do not change over time.

Another aspect of the frame 42 is that it has a dimensionally stable deck or top surface 230. The deck 230 has positioning elements, such as tapered pins 235 (also shown in FIG. 6), at precise locations for positioning the process chambers 50. A transport system, including the robots 44 movable along rails or tracks 46. as shown in FIG.2, may be mounted directly to the floor or platform 250 of the frame 42. By precisely locating the process chambers 50 on the deck 230 via the positioning elements 235, and by supporting the transport system or robots 44 in a fixed relation to the deck 230, process chambers 50 can be replaced from the system 30, without the need to recalibrate movement of the robot 44. As a result, the process chambers 50 are substantially interchangeable and can be quickly replaced, without recalibration of the system 30.

A processing chamber 50 can be repaired or maintained by simply removing the chamber 50 from the deck 230 and replacing it with another chamber having the same mounting hardware configured to engage with the positioning elements 235 on the deck 230, as shown in FIG. 6. As the base mounting ring 56 on the processor 50 is dimensionally stable and has precisely located openings for engaging with the pins or positioning elements 235 on the deck, the processor 50 is automatically precisely located as needed to provide proper operation without recalibrating the robots. As a result, downtime of the system 30 needed for repair or maintenance of processors 50 can be greatly reduced.

During initial calibration, the robots 44 are programmed to move with great precision, to accurately place a wafer 80 onto the support pins 112 of the lower rotor 104. shown in FIGS. 8, 10, 16 and 18. To avoid damaging the wafer 80, the robot 44 must place the wafer 80 within the circle formed by the alignment pins 75 of the upper rotor shown in FIGS. 6 and 9. If the robot 44 places the wafer outside of the target area, the wafer 80 can be damaged as the upper rotor is moved down into engagement with the lower rotor. In addition, for use with other types of spin processors not having precise wafer alignment features (such as pins 75), precise movement and loading by the robot is advantageous to avoid placing the wafer eccentrically in the chamber. By precisely locating the mounting ring 56 and robot 44 relative to the deck 230, the position of the lower rotor 104, of any processor 50 installed in the system 30, is also precisely located relative to the robot. Accordingly, regardless of replacing or interchanging of processors 50, the robot 44 can accurately load and unload wafers 80, without recalibration.

Referring once again to FIG. 22, the frame 42 preferably includes rigid first and second panels 231 and 232, with chamber openings 233 extending through both panels, to receive processors 50. The deck 230 includes positioning elements 234 arranged in a precise pattern on the first or top panel 231. The positioning elements 234 can be holes machined in the first panel 231 at precise locations and/or dowels or pins. The dowels are designed to interface with the mounting ring 56 of the processor 50. Alternatively, the positioning elements 234 can be pins, such as cylindrical or conical pins to project upwardly from the first panel 231.

The deck 230 has a first set of positioning elements 234 associated with each chamber receptacle 233, to accurately position a chamber at a precise location on the frame 42.

The frame 42 also includes side plates 260 along the longitudinal outer edges of the deck 230, interior side plates 261 along longitudinal inner edges of the deck 230, and end plates 262 and 264 attached to the ends of the deck 230. The robot or transport platform 250 is attached to the interior side plates 261 and end plates 262 and 264. The transport platform 250 includes positioning elements 252 for accurately positioning the track 46 of the transport system on the frame 42.

Figure 23:
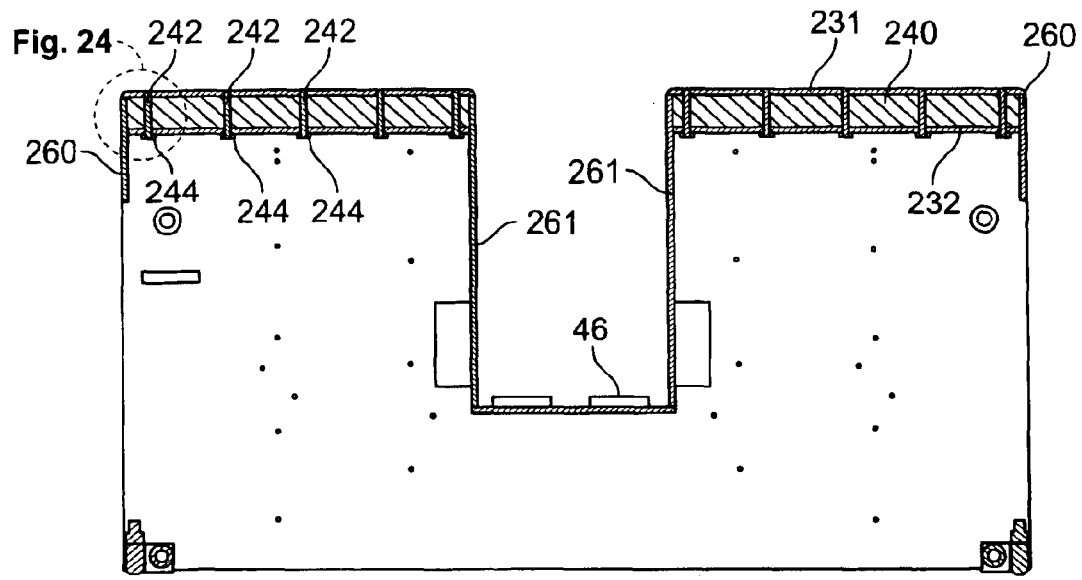
FIG. 23 is a cross-section view taken along line 23—23 of FIG. 22.
Figure 24:
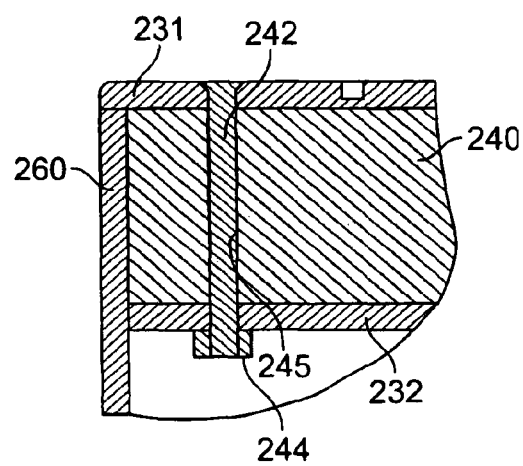
FIG. 24 is an enlarged detail cross section showing a portion of the deck of the mounting module shown in FIGS. 22 and 23.

FIG. 23 is a cross section view showing a preferred internal structure of the deck 230. FIG. 24 is an enlarged detail view of an upper corner section of the deck shown in FIG. 23. In this embodiment, the deck 230 includes bracing 240, such as joists extending laterally between the exterior side plates 260 and the interior side plates 261. The first or top panel 231 is attached to the top side of the bracing 140, and the second or lower panel 232 is attached to the lower side of the bracing 140. The deck 230 can further include bolts 142 passing through the first and second panels and the bracing, to secure them together. Welding may also be used.

The panels and bracing of the deck 230 can be made from stainless steel, other metal alloys, solid cast materials, or fiber-reinforced composites. For example, the panels and plates can be made from Nitronic 50 stainless steel, Hastelloy 625 steel alloys, or a solid cast epoxy filled with mica. The fiber-reinforced composites can include a carbon-fiber or Kevlar® mesh in a hardened resin. The material for the panels 231 and 232 should be highly rigid and compatible with the chemicals used in the chemical processes. Stainless steel is well-suited for many applications because it is strong but not affected by many of the electrolytic solutions or cleaning solutions used in chemical processes. In one embodiment, the panels and plates 231, 232, 260, 261, 262 and 264 are 0.125 to 0.375 inch thick stainless steel, and more specifically they can be 0.250 inch thick stainless steel. The panels and plates, however, can have different thickness in other embodiments.

The bracing 240 can also be stainless steel, fiber-reinforced composite materials, other metal alloys, and/or solid cast materials. In one embodiment, the bracing can be 0.5 to 2.0 inch wide stainless steel joists, and more specifically 1.0 inch wide by 2.0 inches tall stainless steel joists. In other embodiments the bracing 140 can be a honey-comb core or other structures made from metal (e.g., stainless steel, aluminum, titanium, etc.), polymers, fiber glass or other materials.

The frame 42 is constructed by assembling the sections of the deck 230, and then welding or otherwise adhering the end plates 262 and 264 to the sections of the deck 230. The components of the deck 230 are generally secured together by the throughbolts 242 without welds. The outer side plates 260 and the interior side plates 261 are attached to the deck 230 and the end plates 262 and 264 using welds and/or fasteners. The platform 250 is then securely attached to the end plates 262 and 264, and the interior side plates 261. The order in which the mounting module 220 is assembled can have several different embodiments and is not limited to the procedure explained above.

The frame 42 provides a heavy-duty, dimensionally stable structure that maintains the relative positions between the positioning elements 234 on the deck 230 and the positioning elements 252 on the platform 250 within a range that does not require the transport system or robot to be recalibrated each time a replacement processing chamber is mounted to the deck 230. The frame 42 is generally a rigid structure that is sufficiently strong to maintain the relative positions between the positioning elements 234 when the chemical processing chambers 50, and the robots are mounted to the frame 42. In several embodiments, the mounting frame 42 is configured to maintain the relative positions between the positioning elements 134 and to within ±0.025 inch. In other embodiments, the frame is configured to maintain the relative positions between the positioning elements 134 to within approximately ±0.005 to 0.015 inch. As such, the deck often maintains a uniformly flat surface to within approximately 0.025 inch, and in more specific embodiments to approximately 0.005–0.015 inch. Separate manual positioning adjustment of each processor using set screws, jacking screws, shims, washers, etc. is eliminated. Consequently, initial set up, and subsequent operation of the system is much faster and simpler than in the past. Instead of relying on making e.g., over 100 individual three dimensional and/or angular adjustments, as may be needed on multiple processors, the positioning elements automatically provide correct and accurate positioning.

Figure 25:
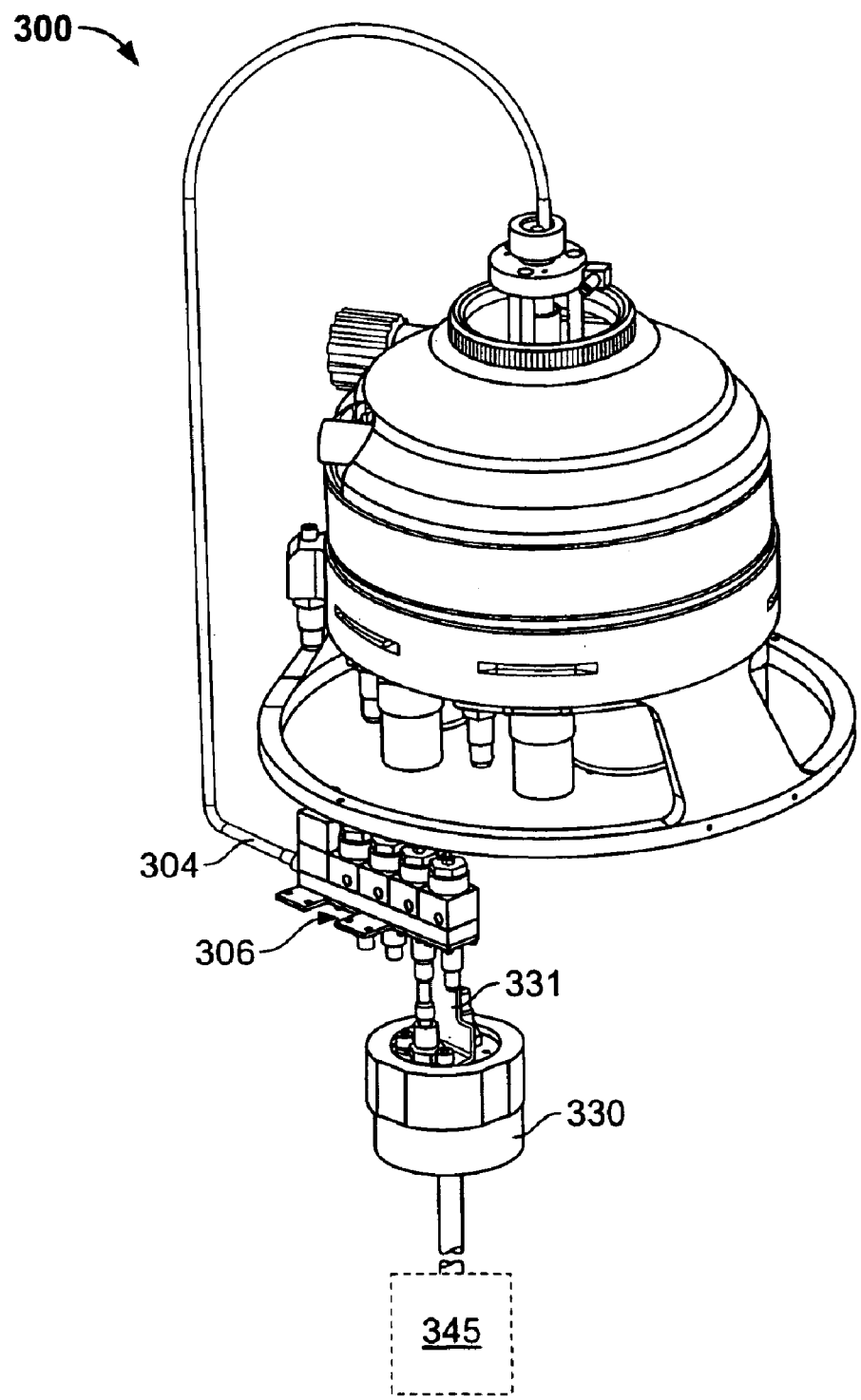
FIG. 25 is a schematic perspective view of an alternative processor for use in the system shown in FIGS. 1 and 2.

FIG. 25 shows an alternative processor 300 which may be used in the system 30 shown in FIGS. 1 and 2. The processor 300 is similar to the processor 50 shown in FIGS. 3–21, with the following changes. The fluid delivery line 304 connecting into the upper nozzle manifold 68 (shown in FIG. 6) is supplied with process fluid through a valve assembly 306. As shown in cross section in FIG. 26, the valve assembly 306 has an array of valves which can be opened to connect a fluid source line to the delivery line 304 extending into the processor 300. Specifically, the valve assembly 306 includes an aspiration valve 307 connecting to an aspiration line 308; a DI water valve 311 connecting to a DI water line 310; a first liquid process chemical valve 312 connecting with a first liquid process chemical line 313; and a second liquid process chemical valve 315 connecting with a second liquid process chemical line 314. A flow meter 338 is positioned at the end of the valve assembly 306 to measure flow in the delivery line 304.

Figure 27:
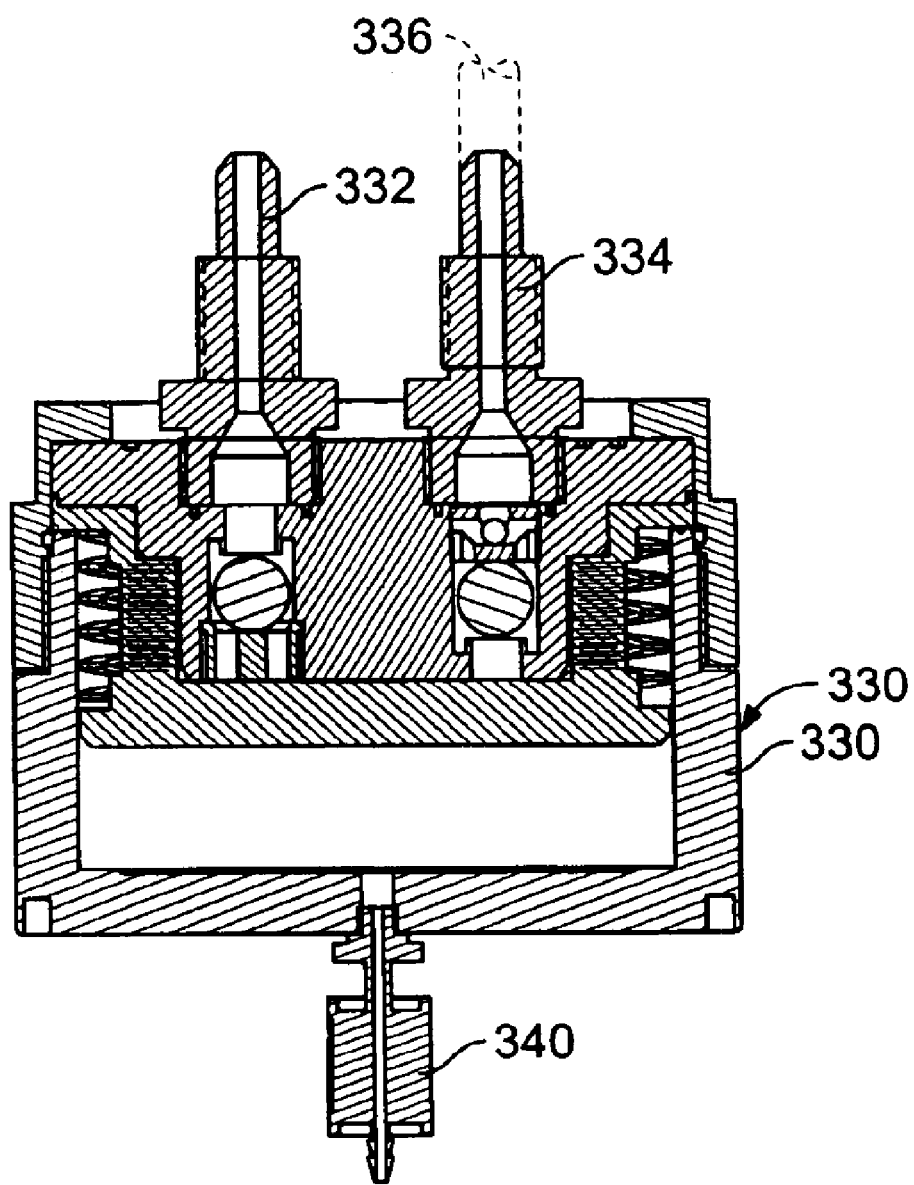
FIG. 27 is a section view of the pump shown in FIGS. 25 and 26.

A fifth valve, or a recovery valve 320 in the valve assembly 306 is connected to an inlet 332 of a pump 330 via an adapter 322. An outlet 334 of the pump 330, shown in FIG. 27, connects to a first or second liquid process chemical source via a fluid line 336. The pump 340 is typically operated via compressed air supplied into the pump housing via a fitting 340. While electrical valve operation may be used, pneumatic control is preferred where flammable or combustible process chemicals (such as solvents) are present. The compressed air for driving the pump 330 is supplied from a source 345 within the manufacturing facility, shown schematically in FIG. 25. The pump 330 is attached to the valve assembly 306 via mounting plate 331. For use in the system shown in FIGS. 1 and 2, a separate reclaim subsystem including the valve assembly 306 and pump 330, is used with each processor.

The number of valves in the valve assembly 306 may of course vary in different systems. In addition, different process liquids or chemicals may also be used. For examples, in some systems, there may be two valves in the valve assembly 306 for deionized water, one for high pressure, and a second for low pressure. In other systems, two liquid process chemicals may be used.

Figure 28:
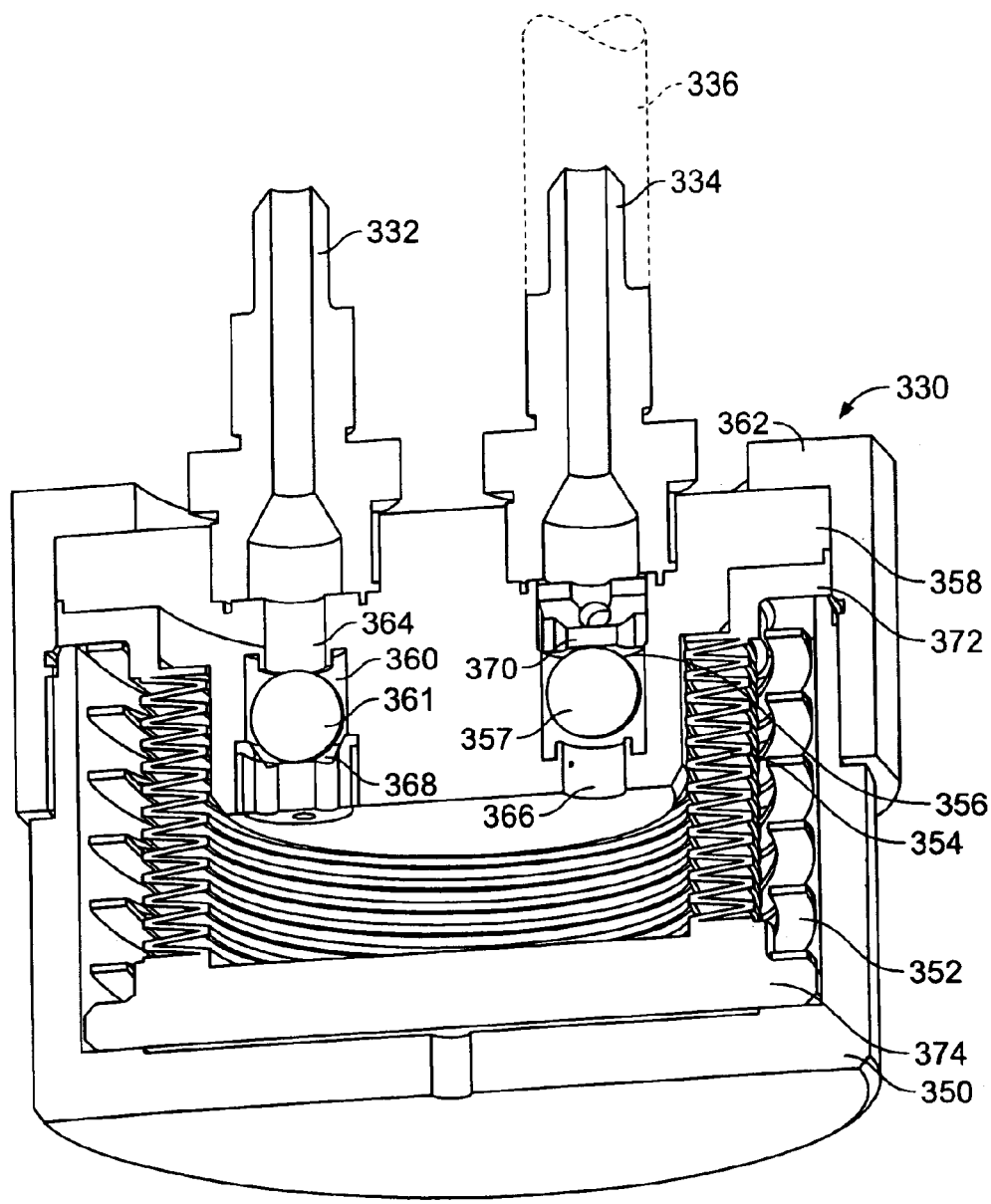
FIG. 28 is a perspective section view of the pump shown in FIG. 25.
Figure 29:
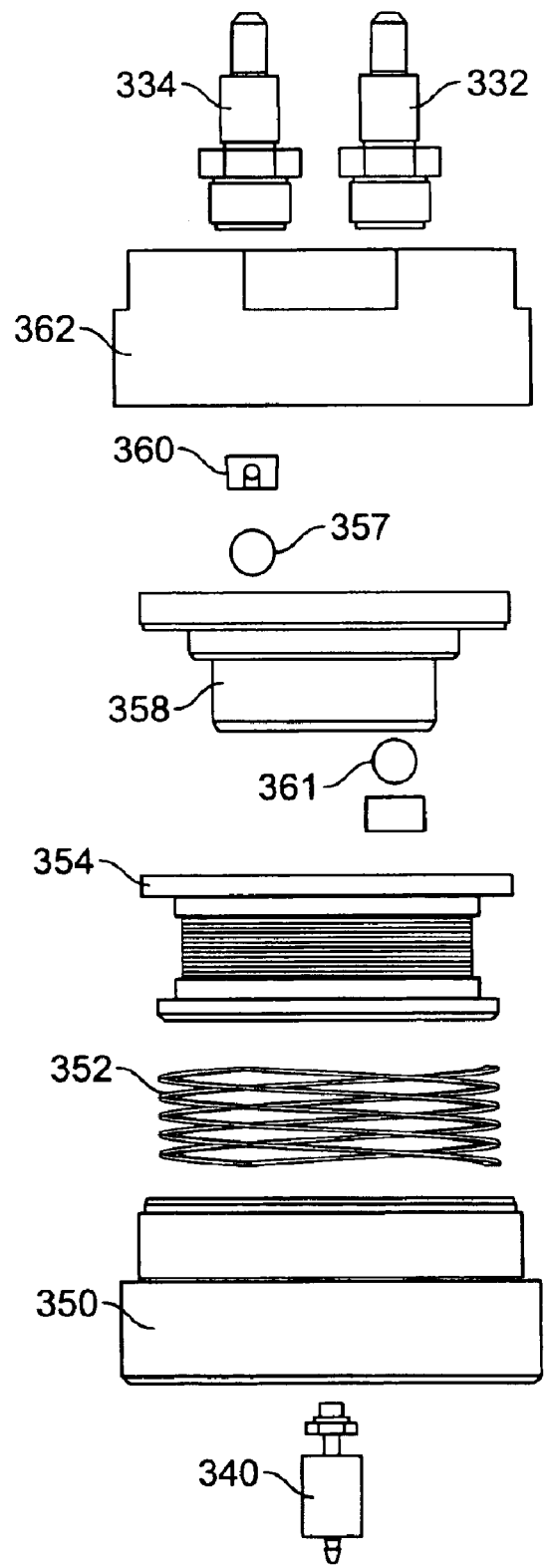
FIG. 29 is an exploded side view thereof.

As shown in FIGS. 28 and 29, the pump 330 includes a bellows 354 positioned within a wavy spring 352 in a pump housing 350. Outlet and inlet check valves 356 and 360 are contained within a check valve block 358. A clamp nut 362 threads onto the pump housing 350 holding the check valve block 358, spring 352 and bellows 354 in place. The inlet fitting 332 is attached to the check valve block 358 and connects into the inlet check valve 360. Similarly, the outlet fitting 334 is attached to the check valve block 358 and connects into the outlet check valve 356.

As shown in FIG. 28, the check valves 356 and 360 do not include springs. Accordingly, the balls 357 and 361 of the check valves 360 and 356 are not intended to provide a 100% seal during pump operation, since the balls rely on fluid pressure to seal in the check valve seat. However, this design is simple, compact, and reliable. An air pressure regulator 340 may optionally be provided in between the compressed air source and the pump 330.

Referring to FIGS. 28 and 29, the pump 330 does not use any piston to actuate the bellows 354. This provides for a highly compact design, and eliminates the need for a precision machined piston and bore. In addition, the potential for binding or failure of the pump is reduced. The pump 330 also accordingly requires less force to move the bellows 354.

The pump 330 also does not use any springs to seat the check valve balls 357 and 361. Each ball 357 and 361 rests within a narrow bore 364 and 366. The liquid flowing through the pump 330 gains velocity in the narrow bores and lifts the balls 357 and 361 into the seats 368 and 370. The bellows 354 is preferably one piece rather than having separate ends or caps. The bellows 354 includes an upper flange 372 and a lower plate 374 (preferably both integral with the body of the bellows), which allow the spring 352 to be wound onto and retained on the bellows 354.

In use, typically only one of the valves in the valve assembly 306 is opened at any given time. For example, initially, the first process chemical valve 312 is opened, allowing a first process liquid to flow from the supply line 313 through the valve 312, into the delivery line 304, through the manifold 68 and out of the nozzle 78 onto the wafer 80. In a typical following step, the DI water valve 311 opens, to rinse the wafer 80, by supplying DI water from the DI water line 310 through the same path to the nozzle 70. The aspirator valve 307 may then open, to evacuate the delivery line 304. If used, a second process chemical liquid is delivered onto the wafer 80 in the process chamber by opening the second process chemical valve 315.

Figure 26:
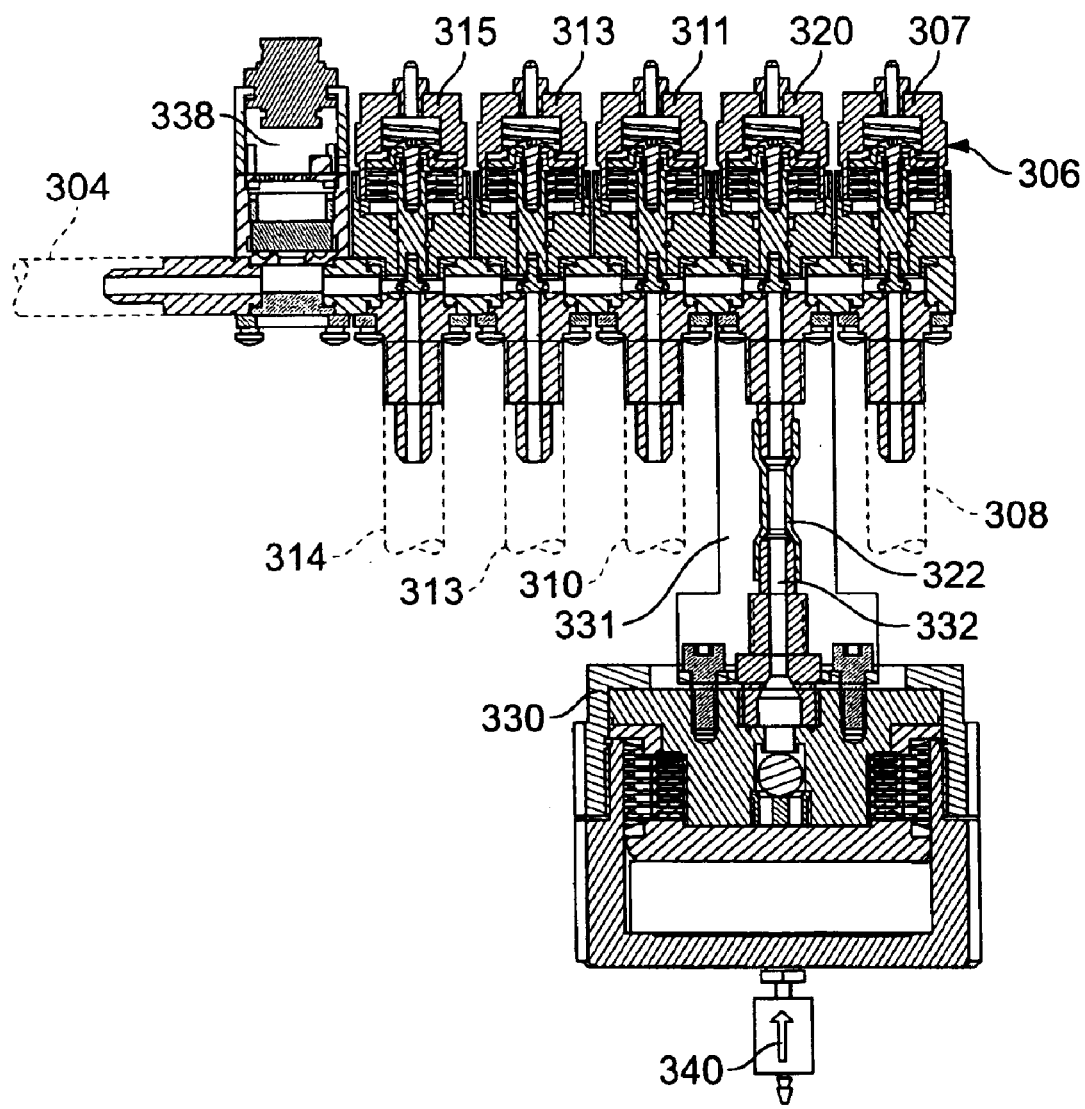
FIG. 26 is a section view of the valve lock assembly shown in FIG. 25.

The embodiment shown in FIGS. 25 and 26 may have various applications, including polymer removal. When used for polymer removal, the valve 312 opens and a first process chemical is delivered into the process chamber. The valve 312 then closes. Next, the return or recovery valve 320 opens, and the pump 330 is turned on. The wavy spring 352 extends or expands via spring force, which also extends the bellows 354. This draws the liquid from the delivery line 304 through the inlet 332 and check valve 360 into the bellows 354. Compressed air is then supplied to the pump 330. The compressed air compresses the fluid filled bellows 354 and the spring 352, pumping the liquid out through the outlet check valve 356 through the outlet fitting 334 and into a return line 336 leading to the tank or source holding the process chemical. Pumping optionally continues until all of the liquid is withdrawn from the delivery line 304. The flow meter 338 and the compressed air source 345 are both preferably linked to the system controller 34, which also controls operation of the valves in the valve assembly 306, as well as various other functions.

The supply of compressed air from the compressed air source 345 is modulated or cycled on and off at appropriate intervals for driving the pump 330. After substantially all fluid has been removed from the delivery line 304, the valve 320 closes. Compressed air may be provided to the return line 336, to push the liquid chemical through the line 336 to the tank. The valve 311 is then opened to provide DI water into the process chamber 125, to rinse the wafer. Valve 311 is closed, stopping supply of DI water. Valve 307 is opened and water in the delivery line 304 is aspirated out. Of course, other methods or sequences may be used in various applications.

In general, the process chemical liquids must be highly pure, and are therefore expensive. The processor 300 conserves on use of process chemical liquids by pumping unused process chemical liquid out of the delivery line 304 and back to the tank or source, for reuse. Specifically, after a first or second process chemical liquid has been delivered into the processor 300, the recovery valve 320 opens and the pump 330 is turned on. The pump 330 draws the liquid out of the delivery 304, and pumps it back to a storage location for reuse.

Typically, the delivery line 304 is about 3, 4 or 5 feet long, and with an inside diameter of e.g., 0.19–0.5 inches, and typically 0.25 inches. Consequently, the delivery line 304 contains a liquid volume of about 35 ml. By use of the system 300 shown in FIGS. 25 and 26, the volume of liquid in the delivery line can be withdrawn and returned to the process liquid tank or source. This avoids wasting the volume of process liquid left in the delivery line 304 at the end of a process step. Consequently, less process liquid is consumed. This saves on the material costs involved in processing wafers. In addition, less chemical waste is generated, providing an environmentally improved system.

The system shown in FIGS. 25 and 26 may also be provided as a retrofit kit. For processing systems of any type having liquids supply lines, the valve assembly 306 and pump 330 may be added into an existing system.

Thus, novel methods and systems have been described. Various changes and modifications can of course be made without departing from the spirit and scope of the invention. The invention, therefore, should not be limited, except to the following claims and their equivalents.

What is claimed is:

1. A system for processing workpieces, comprising:
    a frame;
    a deck on the frame;
    a plurality of processor locating elements on the deck;
    a plurality of workpiece processors on the deck;
    a robot moveable between the processors, for loading and unloading workpieces into and out of the processors; and
    with substantially each processor having two or more positioning elements, with each positioning element engaging a deck locating element on the deck, to locate the processor on the deck with sufficient precision to allow replacement of a processor and operation of the system without a need to recalibrate the robot.

2. The system of claim 1 further comprising a robot track supported on the frame, and with the robot moveable along the robot track.

3. The system of claim 1 with at least one of the processors comprising a lower rotor, and with the engagement of the mounting ring and the processor positioning elements positioning the lower rotor of the processor to within +/−0.02 inches relative to the position of the robot.

4. The system of claim 1 with the deck comprising a top panel and a bottom panel, and bracing attaching the top panel to the bottom panel.

5. The system of claim 1 wherein the positioning elements comprise tapered pins.

6. The system of claim 1 wherein the positioning elements comprise openings in the deck adapted to engage with pins on the mounting ring of the processors.

7. The system of claim 6 further comprising a bushing in one or more of the openings.

8. The system of claim 1 wherein the robot is moveable along a rail structure rigidly attached to the frame.

9. The system of claim 1 wherein the processors are interchangeable without recalibration of the robot.

10. The system of claim 1 with the frame including first and second plates joined to the deck, and first and second interior side plates joined to the deck and to the end plates.

11. The system of claim 10 further including first and second outer side plates joined to the deck and to the first and second end plates.

12. The system of claim 11 further comprising a platform joined to the first and second end plates and to the first and second interior side plates, and with the robot moveable on a track on the platform.

13. The system of claim 1 wherein the processors are arranged in first and second parallel columns and with the robot moveable linearly between the columns.

14. A system for processing workpieces, comprising:
    a frame;
    a deck on the frame;
    a plurality of workpiece processor positions on the deck;
    a robot moveable between the processor positions; and
    locating means for locating a first processor or a second processor at one of the processor positions on the deck with sufficient precision so that the robot can load and unload workpieces into the first or second processor, without recalibrating the robot.

15. The system of claim 14, with the positioining means comprising a mounting ring on the first and second processors engaging two or more positioning elements on the deck, to precisely locate the processor on the deck.

16. The system of claim 14 with the positioning means comprising at least two precision positioning elements on each of the first and second processors, and at least two complementary precision positioning elements on the deck at one of the workpiece processor positions.

17. The system of claim 14 with the locating means including a rigid connection between robot track, on which the robot moves, and the deck.

18. A method for operating a workpiece processing system, comprising the steps of:
    removing a first processor from a first position on a support surface of the system;
    installing a second processor into the first position in the system;
    precisely locating the second processor in the first position by engaging first and second precision positioning elements on the second processor with first and second precision positioning elements on a support surface of the system; and
    moving a robot to load and unload a workpiece into and out of the second processor, without recalibrating the robot.

19. A system for processing workpieces, comprising:
    a processor having an upper fluid outlet;
    a valve assembly;
    a fluid supply line extending from the valve assembly into the processor, to supply fluid to the upper fluid outlet;
    a first and second valves in the valve assembly;
    a first liquid source connecting to the first valve, for supplying a first fluid to the processor; and
    a pump connecting to the second valve, for pumping the first fluid out of the supply line and back to the first fluid source.

20. The system of claim 19 with the pump comprising:
an inlet check valve;
an outlet check valve;
an air pressure operated bellows; and
a spring associated with the bellows.

21. The system of claim 20 wherein at least one of the inlet and outlet check valves includes a ball which seals against a valve seat only via fluid pressure.

22. A system for processing workpieces, comprising:
a processor;
a valve assembly;
a fluid supply line extending from the valve assembly into the processor;
a first, second, third and fourth valves in the valve assembly;
a first liquid source connecting to the first valve, and a second liquid source connecting to the second valve;
a pump connecting to the third valve, for pumping one of the first and second fluids out of the supply line; and
an aspirator connecting to the fourth valve.

23. A method for processing a workpiece, comprising the steps of:
placing the workpiece in a processor;
spinning the workpiece;
opening a first valve to supply a first liquid to the spinning workpiece via a liquid supply line;
closing the first valve;
opening a second valve connected to a suction pump;
actuating the pump to draw the first liquid out of the supply line and into a first liquid source;
turning the pump off;
closing the second valve;
opening a third valve to supply a second liquid to the spinning workpiece;
closing the third valve; and
opening a fourth valve connected to an aspirator, to draw the second liquid out of the supply line and into a drain line.

24. A workpiece processor comprising:
a head including a first rotor;
a base including a second rotor engageable with the first rotor to form a process chamber;
at least one liquid inlet connecting a source of liquid into the process chamber;
at least one outlet for removing liquid from the process chamber; and
at least one precision positioning element on the base, for precisely locating the base within a processing system.

25. The processor of claim 24 wherein the precision positioning element comprises a mounting ring having two or more openings adapted to engage with locating pins on a deck of a processing system.

26. A workpiece processor, comprising:
a first rotor;
a second rotor engageable with the first rotor, to form a process chamber;
a base associated with the second rotor; and
at least one first positioning element on the base engageable with a complimentary second positioning element on a surface supporting the base.

* * * * *